(12) United States Patent
Kobayashi

(10) Patent No.: US 7,795,931 B2
(45) Date of Patent: Sep. 14, 2010

(54) OPERATIONAL COMPARATOR, DIFFERENTIAL OUTPUT CIRCUIT, AND SEMICONDUCTOR INTEGRATED CIRCUIT

(75) Inventor: Shinichiro Kobayashi, Idino (JP)

(73) Assignee: Seiko Epson Corporation, Tokyo (JP)

( * ) Notice: Subject to any disclaimer, the term of this patent is extended or adjusted under 35 U.S.C. 154(b) by 60 days.

(21) Appl. No.: 12/314,566

(22) Filed: Dec. 12, 2008

(65) Prior Publication Data

US 2009/0153199 A1  Jun. 18, 2009

(30) Foreign Application Priority Data

Dec. 17, 2007  (JP)  ............... 2007-324872
Dec. 12, 2008  (JP)  ............... 2008-317716

(51) Int. Cl.
*H03B 1/00* (2006.01)
(52) U.S. Cl. .................... 327/112; 327/563
(58) Field of Classification Search ........ 327/108, 327/109, 111, 112, 560, 563
See application file for complete search history.

(56) References Cited

U.S. PATENT DOCUMENTS

| | | | |
|---|---|---|---|
| 4,972,517 A | 11/1990 | Kondou et al. | |
| 7,098,699 B2 * | 8/2006 | Tamura et al. | 327/108 |
| 7,696,793 B2 * | 4/2010 | Sunairi | 327/108 |

FOREIGN PATENT DOCUMENTS

JP     A-01-226213     9/1989

* cited by examiner

*Primary Examiner*—Jeffrey S Zweizig
(74) *Attorney, Agent, or Firm*—Oliff & Berridge, PLC

(57) ABSTRACT

An operational comparator 10 includes a current source circuit, load circuits driven by the current source circuit, and a current mirror circuit. The load circuits are constituted with MOS transistors, predetermined reference voltage is supplied to the gate terminals of MOS transistors, and each of signal voltages constituting the differential output signal of the differential output circuit is supplied to gate of MOS transistors.

10 Claims, 15 Drawing Sheets

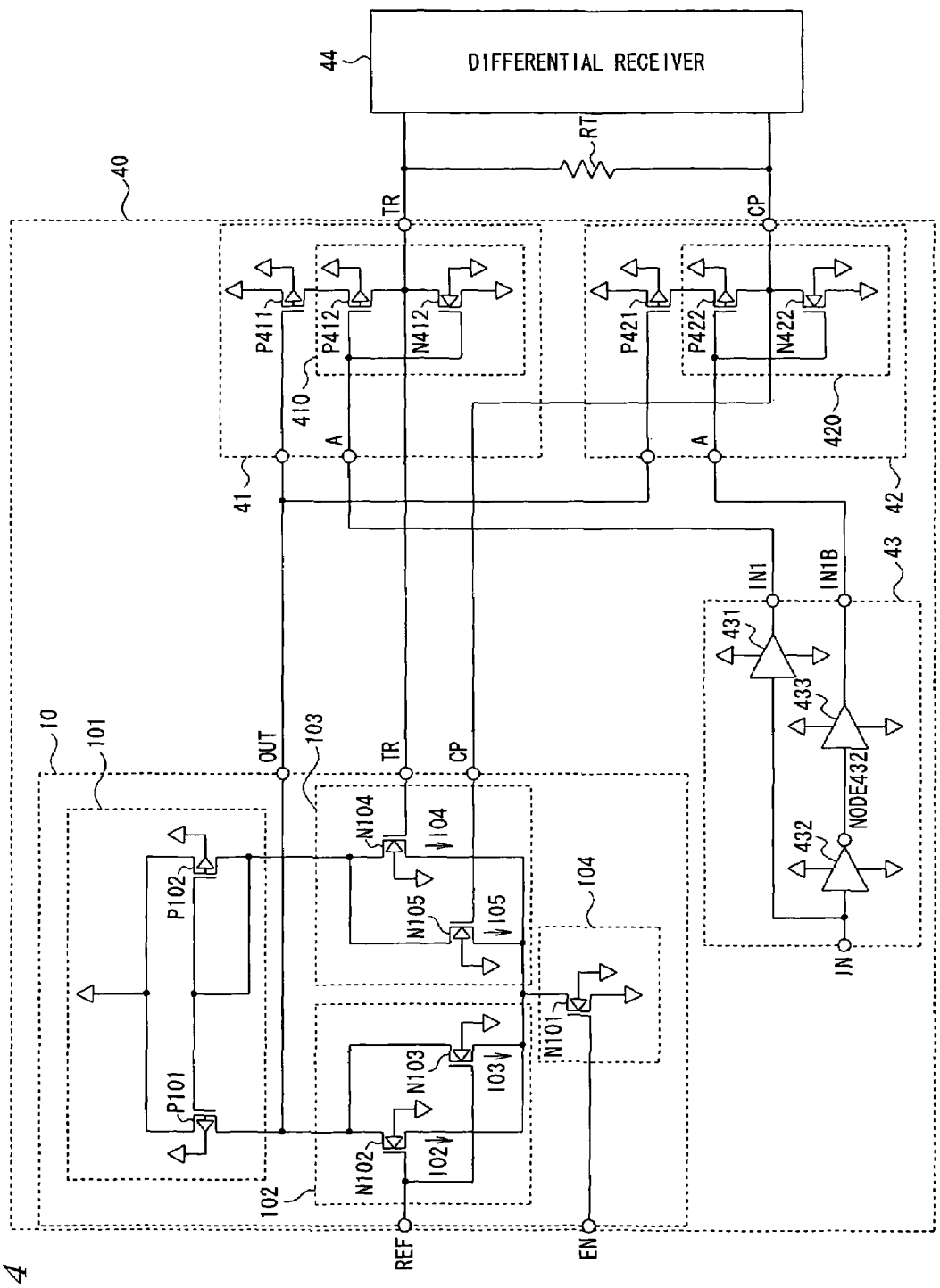
F I G. 4

US 7,795,931 B2

OPERATIONAL COMPARATOR, DIFFERENTIAL OUTPUT CIRCUIT, AND SEMICONDUCTOR INTEGRATED CIRCUIT

Japanese Patent Application No. 2007-324872, filed on Dec. 17, 2007, and Japanese Patent Application No. 2008-317716, filed on Dec. 12, 2008, are hereby incorporated by reference in their entirety.

FIELD OF THE INVENTION

Several aspects of the present invention relate to an operational comparator, a differential output circuit applied to the operational comparator, a semiconductor integrated circuit current comprising the operational comparator or the differential output circuit, and the like.

An differential output circuit generates and outputs a differential signal which includes positive phase signal and opposite phase signal based on input signal, and is known for example in JP H01-226213.

The differential output circuit shown in JP H01-226213 comprises a control circuit which comprises a switching element, two comparison devices, MOS transistors. The control circuit holds an output voltage at a constant voltage, even if a load impedance, which is connected between output terminals, is changed, and controls the output voltage so as not to exceed a predetermined voltage in a case of that the load impedance becomes a constant value or less.

However in the above control circuit of the differential output circuit, the configuration is complex and beside the switching element is needed to switch at every time.

On the other hand recently a LVDS (Low Voltage Differential Signaling) is attracted which can transfer data in low voltage and at high speed. LVDS is one of the low voltage differential signaling standards and the differential output circuit is used in the data transmission therein.

In the differential output circuit of LVDS, as shown in FIG. 5(A), voltages VTR and VCP are generated and outputted respectively to the differential output signal TR and CP, which have opposite phases each other. In this example the width of the amplitude of the differential output voltage is, for example, 400 mV and the common voltage VC which is an intermediate voltage is 1.25 V.

The conventional differential output circuit for LVDS has a built-in reference circuit of the differential output circuit in order to adjust a common voltage VC, and feeds back the differential output voltage of the reference circuit to the reference circuit, for example, which is a built-in band gap circuit.

However in the reference circuit there are problems that the consumed power can not be ignored and besides a tip area becomes large due to the occupation of a constant area for the semiconductor chip.

Furthermore in the above differential output circuit of LVDS since the differential output voltage of the reference circuit is fed back to the band gap circuit, there is a problem that the common voltage can not be adjusted for every differential output circuit in the case of that a plurality of the differential output circuits are provided.

On the other hand, for example, even if in a case of that the differential output circuit is needed to adjust a common voltage, and the differential output signal is transferred at a high speed, it is desired to be able to adjust suitably the common voltage for every differential output circuit.

Incidentally, for example, when a general operational comparator shown in FIG. 3 is applied to the above differential signal, it is easy to obtain the respective comparison results by comparing a common voltage VC and a voltage VTR of the differential signal TR, or a common voltage VC and a voltage VCP of the differential signal CP, however, it is very difficult to detect a width of the amplitude which denotes the relationship between the voltages VTR and VCP of the differential signal TR and CP.

The operational comparator 30 shown in FIG. 3, includes P channel MOS transistors P301 and P302, N channel MOS transistors N301 and N302 to which input signals IN1 and IN2 are supplied, and N channel MOS transistor N303 to which a control input signal EN is supplied.

With using the circuit shown in FIG. 3 detecting the relationship with a common voltage VC including the widths of the amplitudes of the voltages VTR and VCP of the differential signal TR and CP would not only need to occupy the sufficient occupation area but also cause the increase of the consumption power.

SUMMARY OF THE INVENTION

Several aspects of the present invention has an object to provide an operational comparator which can apply to, for example, adjust the common voltage relating to the differential output voltage of the differential output circuit for LVDS, can contribute to the reduction of the consumption power and the occupation area by not using a reference circuit, and can contribute to the adjustment of the common voltage for every differential output circuit, and to provide the operational comparator as a common voltage adjustment circuit.

The present invention has another object to provide a differential output circuit which, for example, in adjusting a common voltage relating the differential output circuit for LVDS, can reduce the consumption power and the occupation area and can adjust the common voltage for every differential output circuit.

In addition the present invention has another object to provide a differential output circuit which, for example, even if in a case of that the differential output circuit is needed to adjust a common voltage, and the differential output signal is transferred at a high speed, can adjust properly the common voltage for every differential output circuit.

In addition the present invention has another object to provide a semiconductor integrated circuit for utilizing the above operational comparator.

In order to solve the above problems and attain the purpose of the invention, the invention comprises the following aspects.

According to the first aspect of the invention, there is provided, an operational comparator comprising:
a first current source circuit that receives a first power voltage from a first power source;
a first load circuit that is coupled to the first current circuit;
a second load circuit that is coupled to the first current source circuit; and
a first current mirror circuit that receives a second power voltage from a second power source, wherein
the first load circuit including a first transistor having a first gate terminal coupled to a reference voltage,
the second load circuit including a second transistor and a third transistor coupled to the second transistor in parallel,
a second gate terminal of the second transistor receiving a first signal, and
a third gate terminal of the third transistor receiving a second signal whose phase is opposite to a phase of the first signal.

According to the second aspect of the invention, in the above configuration, preferably, the first transistor is coupled to a fifth and a sixth transistors in parallel, and coupled with the reference voltage to both gate terminals on the fifth and the sixth transistors.

According to the third aspect of the invention, in the above configuration, preferably, the second, the third, the fourth, and the sixth transistors have same characteristics.

According to the fourth aspect of the invention, there is provided, an operational comparator comprising:
a first and a second current mirror circuits that receives and operates by a first power voltage from a first power source;
a first load circuit that is coupled to a sense side of the first current mirror circuit;
a second load circuit that is coupled to a sense side of the second current mirror circuit;
a first current source circuit that receives a second power voltage from a second power source, and supplies a constant current to the first and the second load circuits; and
a third current mirror circuit that receives the power voltage from the second power source, and includes a first and a second transistors, the first transistor is coupled to a mirror side of the first current mirror circuit, the second transistor is coupled to a mirror side of the second current mirror circuit, wherein
the first load circuit includes a third transistor that has a gate terminal with which a reference voltage is coupled,
the second load circuit includes a fourth transistor and a fifth transistor coupled to the fourth transistor in parallel,
a gate terminal of the fourth transistor receives a first signal, and
a gate terminal of the fifth transistor receives a second signal whose phase is opposite to a phase of the first signal.

According to the fifth aspect of the invention, in the above configuration, preferably, the third transistor is coupled to a seventh and a eighth transistors in parallel, and coupled with the reference voltage to both gate terminals on the seventh and the eighth transistor.

According to the sixth aspect of the invention, in the above configuration, preferably, the fourth, the fifth, the seventh, and the eighth transistors have same characteristics.

According to the seventh aspect of the invention, there is provided, a semiconductor integrated circuit comprising an operational comparator according to any one of the first to sixth aspects, wherein
the operational comparator is located within a high voltage region near by a bounding pad on die.

According to the eighth aspect of the invention, there is provided, a semiconductor integrated circuit comprising an operational comparator according to any one of the first to sixth aspects, wherein
the operational comparator is located within a low voltage region which is closed of a high voltage region of a bounding pad on die.

According to the ninth aspect of the invention, there is provided, a differential output circuit, comprising:
a digital circuits that receives an each power voltage from a first and third power sources, and generate a first non-inverted output signal and a second inverted output signal related on the first input signal;
a first output circuit that receives an each power voltage from the first and a fourth power sources, and controls an output voltage for one side signal in a differential signal related on the first output signal;
a second output circuit that receives and operates by an each power voltage from the first and the fourth power sources, and controls an output voltage for the other side signal in the pair of the differential signal related on the second output signal; and
a first common voltage control circuit that receives and operates by an each power voltage from the first and a second power sources, and outputs the comparison result of both voltages of output terminals of the first output circuit and the second output circuit with a reference voltage, wherein
the first output circuit has a first control circuit that controls an output voltage for one side signal in the differential signal,
the second output circuit has a second control circuit that controls an output voltage for other side signal in the differential signal, and
the first and the second control circuits control voltages for one side signal and other side signal in the differential signal to adjust a common voltage of the differential signal related on the comparison result from the first common voltage control circuit.

According to the tenth aspect of the invention, in the above configuration, preferably, the first common voltage control circuit is comprised by the operational comparator according to any one of the first to sixth aspects.

According to the eleventh aspect of the invention, there is provided, a semiconductor integrated circuit comprising an output circuit, wherein
the output circuit comprises the first and the second output circuits according to the ninth or tenth aspect, and
the first and the second output circuits are located within a high voltage region near by a bounding pad.

According, to the twelfth aspect of the invention, there is provided, a semiconductor integrated circuit comprising an operational comparator and a output circuit, wherein
the operational comparator and the output circuit comprise the operational comparator and the first and the second output circuit according to the tenth aspect, and
the operational comparator is located within a high voltage region between the first and the second output circuits.

According to the thirteenth aspect of the invention, there is provided, a semiconductor integrated circuit comprising an operational comparator and a output circuit, wherein
the operational comparator and the output circuit comprise the operational comparator and the first and the second output circuits according to the tenth aspect, and
the operational comparator is located within a low voltage region near and between the first and the second output circuits.

According to the fourteenth aspect of the invention, there is provided, a differential output circuit, comprising:
a digital circuit that receives an each power voltage from a first and a third power sources, and generates a first non-inverted output signal and a second inverted output signal, related on the first input signal;

a phase adjusting circuit that receives an each power voltage from a first and a fourth power sources, and generates a third output signal and a fourth output signal which has a different phase by 180 degrees from that of the third output signal, related on the first non-inverted output signal and the second inverted output signal;

a first output circuit that receives an each power voltage from the first and the fourth power sources, and generates one side signal in a differential signal related on the third output signal;

a second output circuit that receives an each power voltage from the first and the fourth power sources, and generates other side signal of differential signal related on the fourth output signal; and a first common voltage adjusting circuit that receives an each power voltage from the first and a second power sources, and outputs a comparison result of both voltages of output terminals of the first output circuit and the second output circuit with a reference voltage, wherein the first output circuit has a first control circuit that controls an output voltage for one side signal in the differential signal, the second output circuit has a second control circuit that controls an output voltage for other side signal in the differential signal, and the first and the second control circuits control voltages for one side signal and other side signal in the differential signal to adjust a common voltage of the differential signal, related on the comparison result from the first common voltage control circuit.

According to the fifteenth aspect of the invention, in the above configuration, preferably, the first common voltage control circuit is comprised by the operational comparator according to any one of the first to sixth aspects.

According to the sixteenth aspect of the invention, there is provided, a semiconductor integrated circuit comprising a output circuit, wherein the output circuit comprises the first and the second output circuits according to the fourteenth or fifteenth aspect, and the first and the second output circuits are located within a high voltage region near by a bonding pad.

According to the seventeenth aspect of the invention, there is provided, a semiconductor integrated circuit comprising an operational comparator and a output circuit, wherein the operational comparator and the output circuit comprise the operational comparator and the first and the second output circuits according to the fifteenth aspect, and the operational comparator is located in a high voltage region between the first and the second output circuits.

According to the eighteenth aspect of the invention, there is provided, a semiconductor integrated circuit comprising an operational comparator and a output circuit, wherein the operational comparator and the output circuit comprise the operational comparator and the first and the second output circuit according to the fifteenth aspect, and the operational comparator is located in a low voltage region near and between the first and the second output circuits.

With the operational comparator and the differential output circuit comprising such a configuration applied to the common voltage adjusting circuit of a differential signal having a common voltage, for example, it can be applied to adjust the common voltage relating to the differential output voltage of the differential output circuit for LVDS, and in this case it can contribute to the reduction of the consumption power and the occupation area of differential output circuit, and can contribute to the adjustment of the common voltage independently for every differential output circuit.

In addition according to the differential output circuit of the present invention, for example, in adjusting a common voltage relating the differential output circuit for LVDS, it can reduce the consumption power and the occupation area and can adjust the common voltage independently for every differential output circuit.

In addition according to the differential output circuit of the present invention, for example, even if in a case of that the differential output circuit is needed to adjust a common voltage, and the differential output signal is transferred at a high speed, it can adjust properly the common voltage for every differential output circuit.

In addition according to the semiconductor integrated circuit of the present invention, it can utilize the operational comparator of the present invention.

BRIEF DESCRIPTION OF THE DRAWINGS

Embodiments of the present invention will be described in detail based on the following figures, wherein:

FIG. 4 is a circuit diagram illustrating the configuration according to a first embodiment of the differential output circuit of the present invention;

DETAILED DESCRIPTION OF THE PREFERRED EMBODIMENTS

A description will now be given of embodiments of the present invention, with reference to the accompanying drawings.

Hereinafter, in order to facilitate better understanding the description of the functions, a first power supply voltage is denoted by "VSS" and a second power supply voltage is denoted by "HVDD". Also it is assumed that the substrate terminals (not illustrated) of MOS transistors are applied with each of the respective power supply voltages in which each of MOS transistors resides. In addition it is assumed that a buffer circuit directs to a non-inverted logic output buffer circuit and an inverter circuit directs a inverted logic output buffer circuit.

First Embodiment of an Operational Comparator

Figure 1:
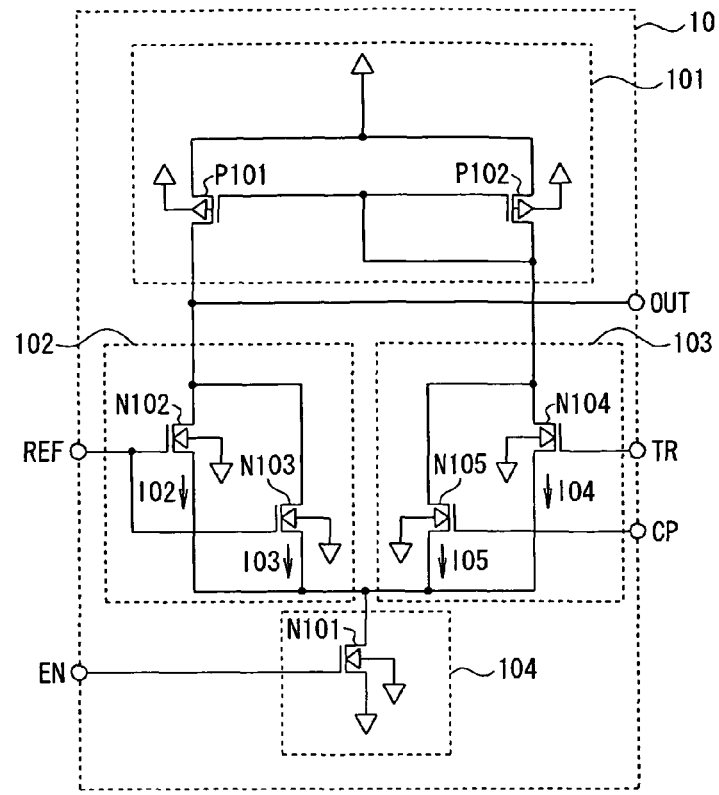
FIG. 1 is a circuit diagram illustrating the configuration according to a first embodiment of the operational comparator of the present invention.

Referring to FIG. 1, the configuration of a first embodiment of an operational comparator according to the invention is described.

An operational comparator 10 in a first embodiment of the invention, as shown in FIG. 1, includes a current mirror circuit 101, a load circuit 102, a load circuit 103, a current source circuit 104. Specially the operational comparator 10 comprises a current mirror circuit 101 in which both of source terminals of P channel MOS transistors P101 and P102 are connected to HVDD and both of gate terminals thereof are connected to drain terminals of P channel MOS transistor P102 so that a drain terminals of P channel MOS transistor P102 becomes to be a sense side output terminal and a drain terminals of P channel MOS transistor P101 becomes to be a mirror-side output terminals.

In addition the operational comparator 10 comprises a load circuit 102 in the current mirror circuit 101, wherein both of the drain terminals of N channel MOS transistors N102 and N103 are connected to the mirror-side output terminal of the current mirror circuit 101, the source terminals thereof are connected each other, and a reference voltage input signal REF is supplied to both of the gate terminals thereof.

In addition the operational comparator 10 comprises a load circuit 103 in the current mirror circuit 101, wherein both of the drain terminals of N channel MOS transistors N104 and N105 are connected to the sense side output terminal of the current mirror circuit 101, the source terminals thereof are connected to source terminals of N channel MOS transistors N102 and N103 which constitute the load circuit 102, TR signal of signals constituting a differential signal is supplied to the gate terminal of N channel MOS transistor N104, and CP signal of the signals constituting this differential signal is supplied to the gate terminal of N channel MOS transistor N105.

In addition the operational comparator 10 comprises a current source circuit 104 for controlling current flowing to the load circuits 102 and 103, wherein the source terminal of N channel MOS transistor 101 is connected to VSS, the drain terminal is connected to the source terminals of N channel MOS transistors N102, N103, N104, and N105 constituting the load circuits 102 and 103, and a control input signal EN is supplied to the gate terminal. Incidentally above MOS transistors N102, N103, N104, and N105 have the same characteristics.

Therefore each current between the source and drain terminals of N channel MOS transistors N102, N103, N104, and N105 depends to each ON resistance of N channel MOS transistors N102, N103, N104, and N105. In addition each ON resistance of N channel MOS transistors N102, N103, N104, and N105 is determined by the voltages applied to the gate terminals of N channel MOS transistors N102, N103, N104, and N105.

Figure 12:
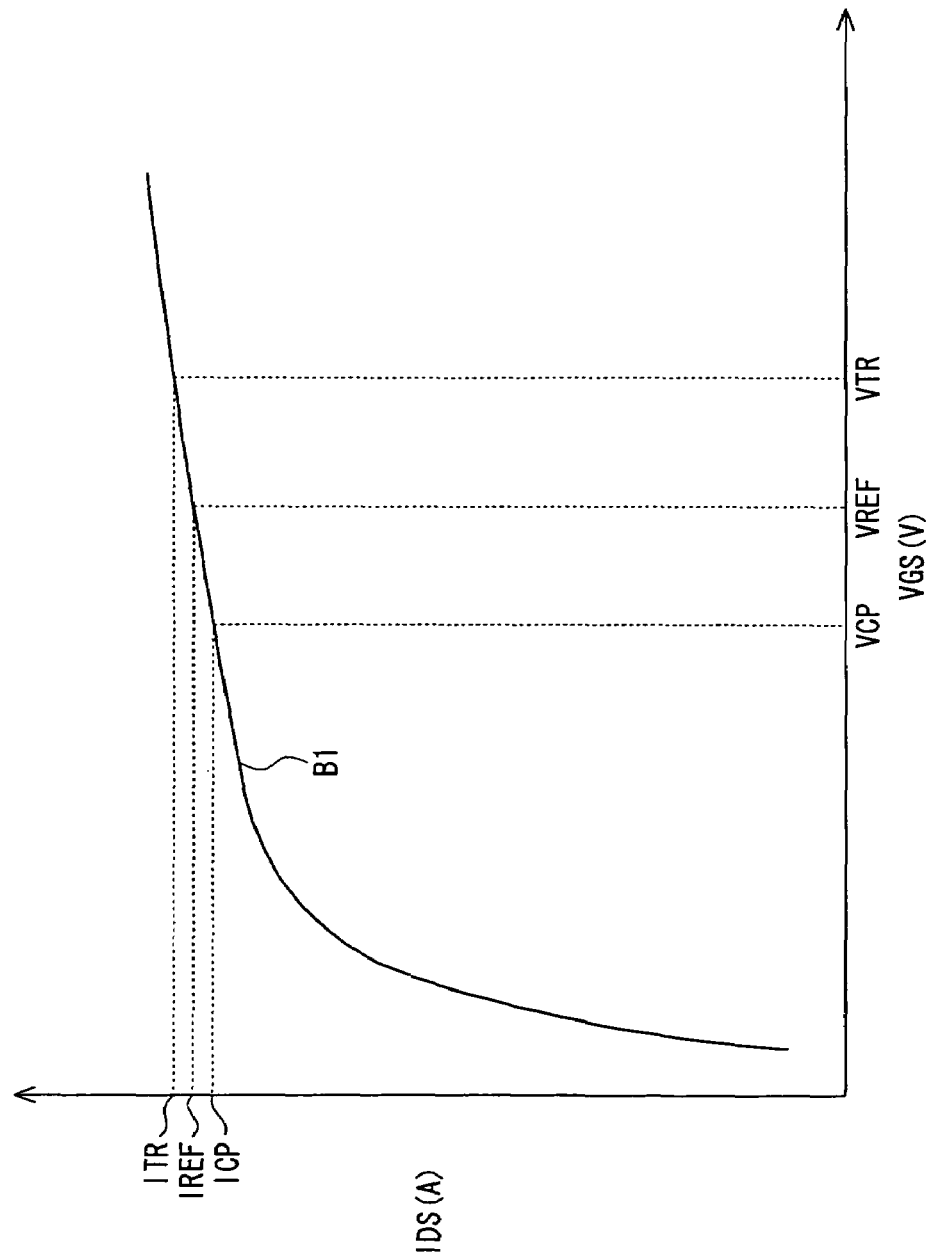
FIG. 12 is a diagram illustrating the static characteristic of MOS transistor.

In the constant state if it is assumed that the currents between source and drain terminals of N channel MOS transistors N102 and N103 are I02 and I03, since in N channel MOS transistors N102 and N103 the source terminal and the drain terminal are common and a reference voltage VREF is applied to both gate terminals, the currents between source and drain terminals 102 and 103 are equal and the current value is represented by the following equation, with reference to FIG. 12.

$$I02=I03=IREF$$

Therefore the current I102 flowing in the load circuit I02 is a sum of the currents I02 and I03 between source and drain terminals of N channel MOS transistors N102 and N103 and this is represented by the following equation:

$$I102=I02+I03=2\times I02 \quad (1)$$

The voltage VTR for one side signal TR in the pair of the differential signal is applied to the gate terminal of N channel MOS transistor N104. In this state the current I04 between source and drain terminals of N channel MOS transistor N104 is represented by the following equation. Wherein if it is assumed that the difference of the current IREF between source and drain terminals and the current I04 is ΔITR, when the voltage of the gate terminal of N channel MOS transistor N104 is VREF, and that if the voltages VTR and VCP of the pair of the differential signal TR and CP are in a state of VTR>VCP, $$I04=ITR=IREF+\Delta ITR \quad (2)$$

is obtained

On the other hand the voltage VCP for one side signal CP in the pair of the differential signal is applied to the gate terminal of N channel MOS transistor N105. In this state the current I05 between source and drain terminals of N channel MOS transistor N105 is represented by the following equation. Wherein, if it is assumed that the difference of the current IREF between source and drain terminals and the current I05 is ΔICP, when the voltage of the gate terminal of N channel MOS transistor N105 is VREF, and that the voltages VTR and VCP of the pair of the differential signal TR and CP are in a state of VTR>VCP, $$I05=ICP=IREF-\Delta ICP \quad (3)$$

is obtained.

The current I103 flowing in the load circuit 103 is a sum of the currents I04 and I05 between the source and drain terminals of N channel MOS transistors N104 and N105. Therefore the following equation is obtained in view of the equations (2) and (3):

$$I103=I04+I05=2\times IREF+(\Delta ITR-\Delta ICP) \quad (4)$$

There is a difference of voltages DV in each voltage VTR and VCP of the pair of the differential signal TR and CP and the common voltage VC is a intermediate voltage between the voltages VTR and VCP. Therefore each voltage VTR and VCP of the pair of the differential signal TR and CP is VC± (VD/2).

As shown in FIG. 12, the static characteristic B1 in the linear region of MOS transistor can be regarded as a straight line having an inclination with moderately elevated. Thus since ΔITR approximates ΔICP, the equation (3) is represented by the following equation:

$$I103 = I04 + I05 = 2 \times IREF \quad (5)$$

Therefore, if it is considered of the operations of the operational comparator 10 including the current mirror circuit 101, the operational comparator 10 compares 2×I02 in the equation (1) with I04+I05 in the equation (5) and the result is outputted as the voltage of the output terminal OUT.

Namely this means comparing I02 with (I04+I05)/2 and outputting the result as the voltage of the output terminal OUT.

Since the common voltage VC of the pair of the differential signal corresponds to ½ of the difference of voltages for one side signal and other side signal in the differential signal, it will be comprehended that comparing I02 with (I04+I05)/2 means comparing the reference voltage with the common voltage VC of the differential signal.

As described above, if the first embodiment of the operational comparator is applied to the common voltage adjusting circuit of the pair of the differential signal having the common voltage, it may be applied to, for example, the adjustment of the common voltage relating the differential output voltage of the differential output circuit in LVDS. In this case it can contribute to the reduction of the consumption power and the occupation area of the differential output circuit and also contribute to the adjustment of the common voltage for every differential output circuit.

Incidentally in FIG. 1, N channel MOS transistors N102, N103, N104, and N105 are described as MOS transistors having the same amplifier factor β but N channel MOS transistors N102 and N103 do not needed to be divided in view of the functions of the present invention and they may be constituted of N channel MOS transistor having the same amplifier factor β as the MOS transistor which N channel MOS transistors 102 and N103 are connected in parallel.

Second Embodiment of the Operational Comparator

Figure 2:
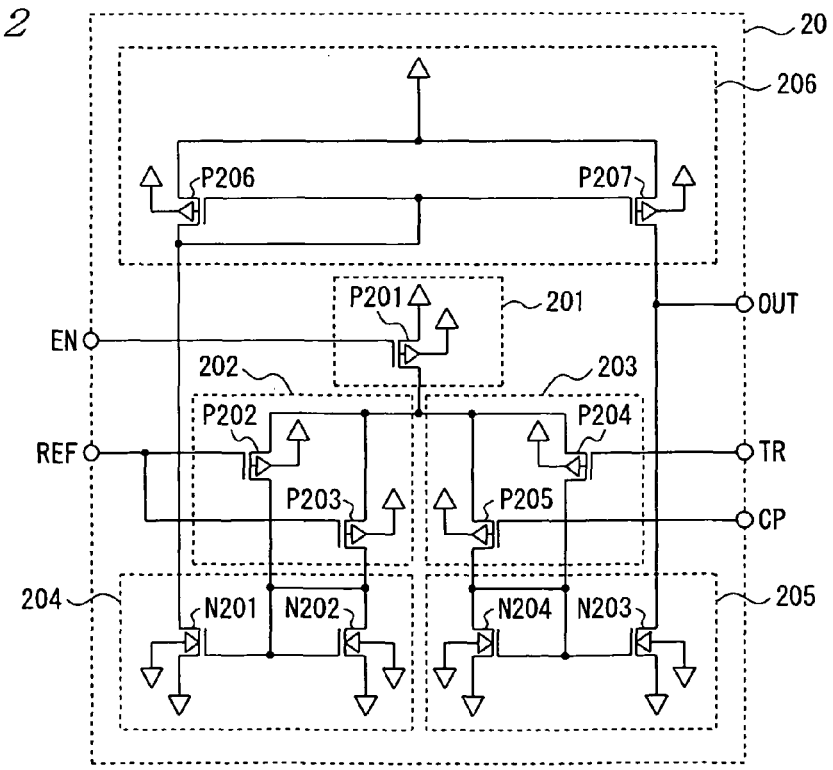
FIG. 2 is a circuit diagram illustrating the configuration according to a second embodiment of the operational comparator of the present invention.

Referring to FIG. 2, the configuration of a second embodiment of the operational comparator according to the invention is described.

The operational comparator 20 according to the second embodiment of the invention comprises a current source circuit 201, a load circuit 202, a load circuit 203, a current mirror circuit 204, a current mirror circuit 205, and a current mirror circuit 206.

Specially, the operational comparator 20 comprises a current source circuit 201 in which the source terminal of P channel MOS transistor P210 is connected to HVDD and the gate terminal is connected to control input signal EN.

In addition the operational comparator 20 comprises a load circuit 202 in which both of the drain terminals of P channel MOS transistors P202 and P203 are connected to the current source circuit 201, both of the gate terminals thereof are supplied with a reference voltage VREF, and the source terminals are connected each other.

In addition the operational comparator 20 comprises a load circuit 203 in which both of the drain terminals of P channel MOS transistors P204 and P205 are connected to the current source circuit 201, the gate terminal of P channel MOS transistor P204 is supplied with TR signal of the signals constituting the pair of the differential signal, the gate terminal of P channel MOS transistor P205 is supplied with CP signal of the signals constituting the pair of the differential signal, and the source terminals are connected each other.

In addition the operational comparator 20 comprises a current mirror circuit 204 in which the source terminals of N channel MOS transistors N201 and N202 are connected to VSS, the gate terminals thereof are connected to the drain terminal of N channel MOS transistor N202, and further connected to the drain terminals of P channel MOS transistors P202 and P203 constituting the load circuit 202.

In addition the operational comparator 20 comprises a current mirror circuit 205 in which the source terminals of N channel MOS transistors N203 and N204 are connected to VSS, the gate terminals are connected to the drain terminals of N channel MOS transistor N204 and further connected to the drain terminals of P channel MOS transistors P204 and P205 constituting the load circuit 203.

In addition the operational comparator 20 comprises a current mirror circuit 206 in which the source terminals of P channel MOS transistors P206 and P207 are connected to HVDD, the gate terminals thereof are connected to the drain terminals of P channel MOS transistor P206, and further connected to the drain terminal of N channel MOS transistor N201 constituting the current mirror circuit 204, and the drain terminal of P channel MOS transistor P207 is connected to the drain terminal of N channel MOS transistor N203 constituting the current mirror circuit 205, and the connection point thereof is the output terminal OUT.

The above MOS transistor P202, P203, P204, and P205 have the same characteristics. Besides MOS transistors P202 and P203 may be constituted as a whole.

With such a configuration of the operational comparator of the second embodiment may realize the same effects and advantages with the first embodiment shown in FIG. 1.

First Embodiment of the Differential Output Circuit

The configuration of the first embodiment of the differential output circuit, in case of that the operational comparator of the invention is applied to the differential signal output circuit, will be described with reference to FIG. 4.

As shown in FIG. 4, the embodiment of the differential output circuit of the present invention comprises, in addition to the operational comparator 10 of the common voltage adjusting circuit shown in FIG. 1, an inverter circuit 41 with output voltage adjustment function of output circuit, an inverter circuit 42 with output voltage adjustment function of output circuit, and a logic circuit 43.

The configuration of the operational comparator 10 has been described heretofore so that the same reference numerals will be given to the same components to omit the description thereof.

The differential output circuit 40 comprises an inverter circuit 41 with output voltage adjustment function in which the source terminal of P channel MOS transistor P411 is connected to HVDD, the drain terminal is connected to the source terminal of P channel MOS transistor P412, the gate terminal is connected to the output terminal OUT of the operational comparator 10, and which comprises an inverter circuit 410 in which is composed of P channel MOS transistor P412 and N channel MOS transistor N412, the gate terminal is connected to the input terminal A, the source terminal of N channel MOS transistor N412 is connected to VSS, and the drain terminals of P channel MOS transistor P412 and N channel MOS transistor N412 are connected to the output terminal TR.

In addition the differential output circuit 40 comprises an inverter circuit 42 with output voltage adjustment function in which the source terminal of P channel MOS transistor P421 is connected to HVDD, the drain terminal is connected to the source terminal of P channel MOS transistor P422, the gate terminal is connected to the output terminal OUT of the operational comparator 10, and which comprises an inverter circuit 420 in which is composed of P channel MOS transistor P422 and N channel MOS transistor N422, the gate terminal is connected to the input terminal A, the source terminal of N channel MOS transistor N422 is connected to VSS, and the drain terminals of P channel MOS transistors P422 and N channel MOS transistor N422 are connected to the output terminal CP.

In addition the differential output circuit 40 comprises a buffer circuit 431 in which the power source terminal is connected to HVDD, the ground terminal is connected to VSS, and a non-inverted signal IN1 is generated for an input signal IN.

In addition the differential output circuit 40 comprises an inverter circuit 432 in which the power source terminal is connected to HVDD, the ground terminal is connected to VSS, and a inverted signal is generated for an input signal IN, and a buffer circuit 433 in which the power source terminal is connected to HVDD, the ground terminal is connected to VSS, the input terminal is connected to the output terminal of the inverter circuit 432, and the output terminal is connected to the output terminal IN1B.

The external resistance RT in FIG. 4 is a termination resistance which is connected to the external of the differential output signal circuit when a transmission line is build-up with the differential signal by using the differential output signal of the invention, and is used in the later description.

Figure 5:
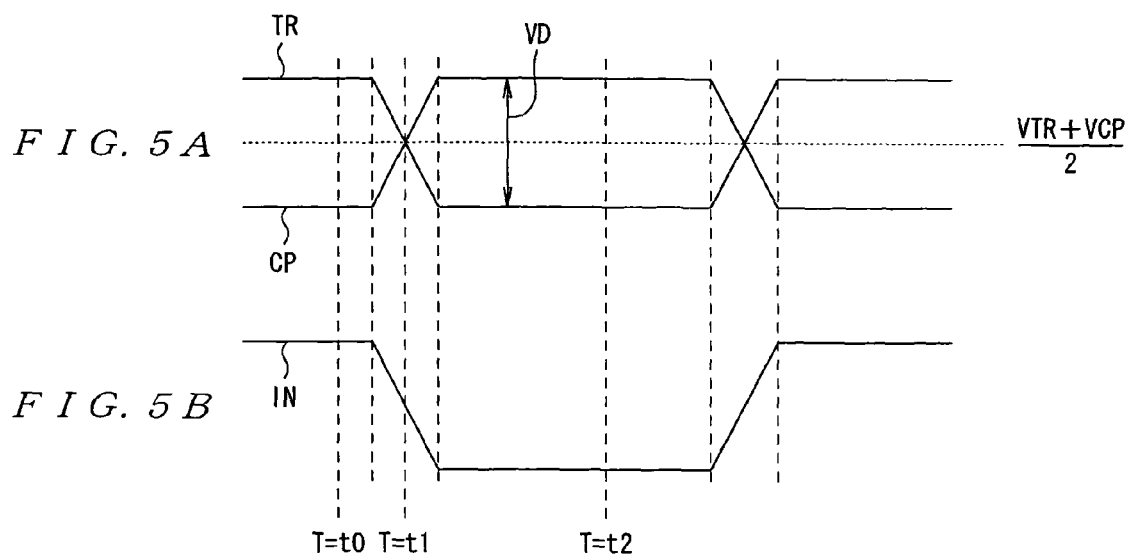
FIG. 5 is a waveform diagram illustrating an example of an input signal and a differential output signal of a differential output circuit of the present invention.

Referring now FIG. 4 and FIG. 5, the detail operations of the first embodiment of the differential output circuit in the case of that the first embodiment of the operational comparator of the invention is applied to the differential signal output circuit.

Incidentally in FIG. 5 there is omitted a delay time of an element not needed in the detail operations of the first embodiment of the differential output circuit in the case of that the first embodiment of the operational comparator of the invention is applied to the differential signal output circuit.

In the constant state (T=t0) in FIG. 5, in the first embodiment of the differential output circuit in the case of that the first embodiment of the operational comparator of the invention is applied to the differential signal output circuit, when it is assumed that the voltage of the input terminal REF is VREF, each voltage of the differential signal TR and CP is VTR and VCP, $$VREF=(VTR+VCP)/2$$

is obtained.

That is to say, since the input signal IN is in High level, P channel MOS transistor P412 is in OFF state and N channel MOS transistor N412 is in ON state, among the MOS transistors constituting the inverter circuit 41 with output voltage adjusting function, and N channel MOS transistor N422 is in OFF state and P channel MOS transistor P422 is in ON state.

Hence a current path is constituted by P channel MOS transistor P421 and P422, termination resistance RT, and N channel MOS transistor N412, and in the differential signal terminals TR and CP, terminal voltages are generated, to which the power supply voltage is divided by each voltage of ON resistance between source and drain terminals of P channel MOS transistors P421 and P422, a termination resistance RT, and ON resistance between source and drain terminals of N channel MOS transistor P412.

When it is assumed that the power source voltage of HVDD is VDD, ON resistance of P channel MOS transistor P421 is RP421, ON resistance between source and drain terminals of P channel MOS transistor P422 is RP422, the termination resistance is RRT, and ON resistance between source and drain terminals of N channel MOS transistor N412 is RN412, each terminal voltages VTR and VCP of the differential signal terminals TR and CP are determined by the following equations:

$$VTR=(VDD \times RN412)/(RP421+RP422+RRT+RN412)$$

$$VCP=VDD \times (RRT+RN412)/(RP421+RP422+RRT+RN412)$$

As above described, in the operational comparator 10 since the reference voltage VREF and each voltage VTR and VCP of the differential signal TR and CP are compared, and the output signal is fed back to the inverter circuits 41 and 42 with output voltage adjusting function, the equation VREF=(VTR+VCP)/2 is always maintained.

When the current I103 flowing in the load circuit 103 is larger than the current I102 flowing in the load circuit 102, that is, when (VTR+VCP) is higher than (2×VREF), lower current than the current flowing in the sense side, flows in the mirror side terminal of the current mirror circuit 101 and thus the voltage of output terminal OUT of the operational comparator 10 is increased.

The output terminal OUT of the operational comparator 10 is fed back to the gate terminal of P channel MOS transistor P421 constituting the inverter circuit 42 with output voltage adjusting function and when the sum of the voltages of the differential signal TR and CP is larger than (2×VREF), the voltage of the output terminal OUT of the operational comparator 10 is increased and thus ON resistance between source and drain terminals of P channel MOS transistor P421, constituting the inverter circuit 42 with output voltage adjusting function, is increased.

In this case, when it is assumed that ON resistance between source and drain terminals of P channel MOS transistor P421 is RP421', the following equations are obtained.

$$VTR=(VDD \times RN412)/(RP421'+RP422+RRT+RN412)$$

$$VCP=(VDD \times (RRT+RN412)/(RP421'+RP422+RRT+RN412)$$

From RP412<RP421', each voltage of the pair of the differential signal TR and TC is decreased.

In case the current I103 flowing in the load circuit 103 is smaller than current flowing in the load circuit 102, that is, in case VTR+VCP is lower than 2×VREF, current flowing in the mirror side terminal of the current mirror circuit is larger than the current flowing in the sense side, and then the voltage of the output terminal OUT becomes to be lower.

The output terminal OUT of the operational comparator is feed back to the gate terminal of P channel MOS transistor P421 constituting the inverter circuit 42 with output voltage adjusting function. Therefore when the sum of the voltages VTR and VCP of this differential signal TR and CP is larger than 2×VREF, the voltage in the output terminal OUT of the operational comparator 10 becomes to be lower and the ON resistance between source and drain terminals of P channel MOS transistor P421, constituting the inverter circuit 42 with output voltage adjusting function, is decreased.

At this time if the ON resistance between source and drain terminals of P channel MOS transistor P421 is RP421", the following equations are obtained.

$$VTR=(VDD \times RN412)/(RP421''+RP422+RRT+RN412)$$

$$VCP=VDD \times (RRT+RN412)/(RP421''+RP422+RRT+RN412)$$

From RP421>RP421", each voltage of the pair of the differential signal is increased.

As stated above, in the first embodiment a correction is conducted so as to be in state of 2×VREF=VTR+VCP, that is, the terminal voltages VTR and VCP of the pair of the differential signal TR and CP and the reference voltage VREF are stable in the state of VREF=(VTR+VCP)/2. In the third embodiment the terminal voltages VTR and VCP of the pair of the differential signal TR and CP and the reference voltage VREF maintain the state VREF=(VTR+VCP)/2 even in the transition state (T=t1) in FIG. 5.

However one side signal TR and other side signal CP in the pair of the differential output signal with the input signal IN, the differential output signal TR transits from low level voltage to high level voltage, and the differential output signal CP transits from high level voltage to low level voltage.

This is the reasons that in the inverter circuit 41 with output voltage adjusting function, due to the input signal IN, P channel MOS transistor P412 becomes from OFF state to ON state, in contrast N channel MOS transistor N412 becomes from ON state to OFF state, and in the inverter circuit 42 with the output voltage adjusting function N channel MOS transistor N422 becomes from OFF state to ON state, in contrast P channel MOS transistor P422 becomes from ON state to OFF state.

However the operational comparator 10, as described above, without the input signal IN, always conducts the above comparison operation of each terminal voltage VTR and VCP of the pair of the differential signal TR and CP with the reference voltage VREF and since the result is fed back to the inverter circuit 41 with output voltage adjusting function, VREF=(VTR+VCP)/2 is also maintained even in T=t1.

Similarly in the following constant state (T=t2) in FIG. 5, the operational comparator 40 compares ½ of the sum of the voltages VTR and VCP of the pair of the differential signal TR and CP with the reference voltage VREF and since the result is fed back to the inverter circuit 41 with output voltage adjusting function, VREF=(VTR+VCP)/2 is also maintained even in T=t2.

Second Embodiment of the Differential Output Circuit

Figure 6:
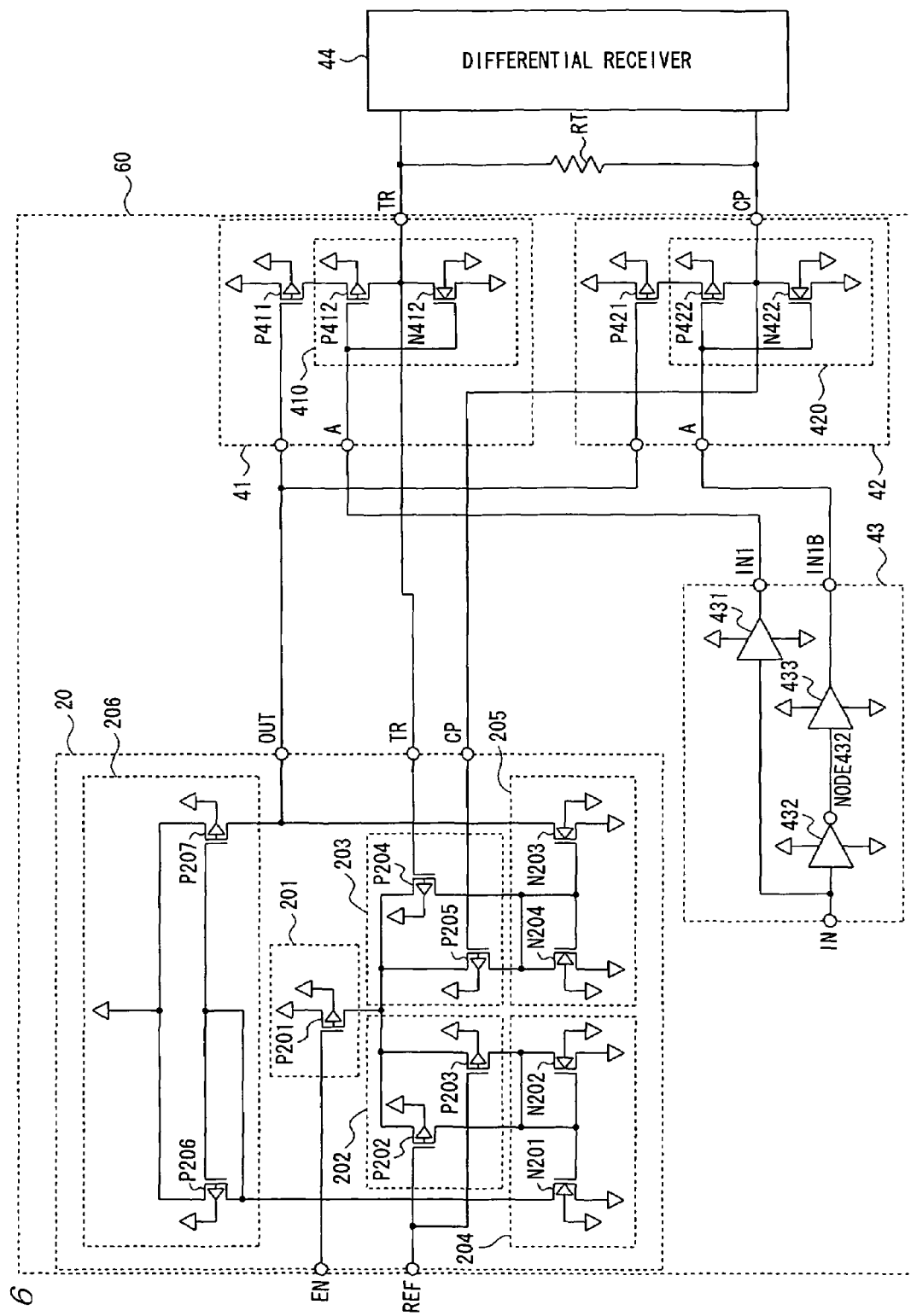
FIG. 6 is a circuit diagram illustrating the configuration according to a second embodiment of the differential output circuit of the present invention.

Referring to FIG. 6, the configuration of a second embodiment of the differential output circuit, in case of that the second embodiment of the operational comparator of the invention is applied to the differential signal output circuit, will be described.

The second embodiment of the differential output circuit of the invention is related to the first embodiment of the differential output circuit shown in FIG. 4 and wherein the operational comparator 10 in FIG. 4 is replaced with the operational comparator 20 in FIG. 2.

Therefore the differential output circuit 60 of the second embodiment comprises an operational comparator 20 of a common voltage adjusting circuit, an inverter circuit 41 with output voltage adjusting function of an output circuit, an inverter circuit 42 with output voltage adjusting function of an output circuit, and a logic circuit 43.

However since each of the above configuration element has already described, the same reference numerals will be given to the same components to omit the description thereof.

Referring now FIG. 6 and FIG. 5, the detail operations of the second embodiment of the differential output circuit, in the case of that the second embodiment of the operational comparator of the invention is applied to the differential signal output circuit.

In the operational comparator 20, the ON resistance between the source and drain terminals of P channel MOS transistors P202 and P203 of the load circuit 202 constituting the operational comparator 20 is determined by the voltage VREF applied to the input terminal REF.

Also the ON resistance between the source and drain terminals of P channel MOS transistors P204 of the load circuit 203 is determined by applying the voltage VTR for one side signal TR in the pair of the differential signal to the gate terminal, and the ON resistance between the source and drain terminals of P channel MOS transistor P205 is determined by applying the voltage VCP for another side signal CP in the pair of the differential signal to the gate terminal.

At this time according to Kirchhoff's laws, the sum of the currents flowing in the load circuits 202 and 203 equals to the current flowing in the current source circuit 201, consequently the current flowing in the current source circuit 201 is divided by the inside combined resistance value of the load circuits 202 and 203.

Therefore a current is determined which flows to the sense side of the current mirror circuits 204 and 205 and these results are amplified by the current mirror circuit 206 and outputted to the output terminal OUT as a comparison result.

If VTR+VCP is higher than 2×VREF, and then the current flowing in the load circuit 202 is smaller than the current flowing in the load circuit 203, and the voltage of the output terminal OUT of the operational comparator 20 is increased, and if VTR+VCP is lower than 2×VREF, and then the current flowing in the load circuit 202 is larger than the current flowing in the load circuit 203, and the voltage of the output terminal OUT of the operational comparator 20 is decreased.

This comparison result in the operational comparator 20 is fed back to the inverter circuits 41 and 42 with output voltage adjusting function through the output terminal OUT.

Therefore the same operations are conducted which are described in the detail descriptions of the first embodiment of the differential output circuit, in the case of that the first embodiment of the operational comparator of the invention is applied to the differential signal output circuit.

Third Embodiment of the Differential Output Circuit

Figure 7:
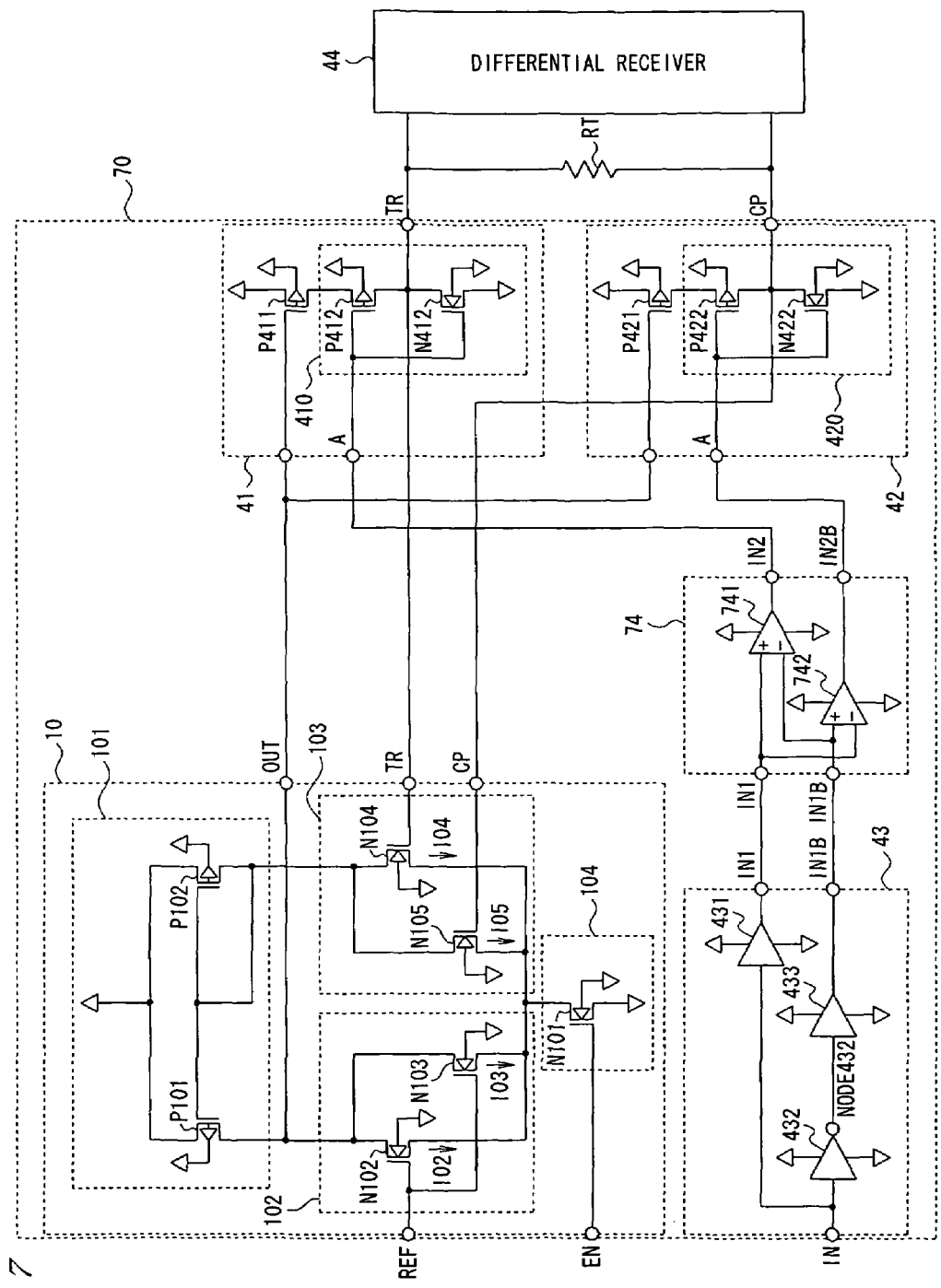
FIG. 7 is a circuit diagram illustrating the configuration according to a third embodiment of the differential output circuit of the present invention.

Referring to FIG. 7, the configuration of a third embodiment of the differential output circuit, in the case of that the first embodiment of the operational comparator of the invention is applied to the differential signal output circuit will be described.

Incidentally in the description below, in order to clarify the description of the functions, it is assumed that the first power supply voltage is VSS, the second and the fourth power supply voltages are HVDD, and the third power supply voltage is LVDD, and each power supply voltage in which each MOS transistor resides is applied to the substrate terminals (not shown) of the MOS transistors.

The third embodiment of the differential output circuit of the invention is based on the configuration of the first embodiment of the differential output circuit shown in FIG. 4 and wherein a functional circuit 74 is added as shown in FIG. 7.

Therefore the differential output circuit 70 of the third embodiment comprises an operational comparator 10 of a common voltage adjusting circuit, an inverter circuit 41 with output voltage adjusting function of an output circuit, an inverter circuit 42 with output voltage adjusting function of an output circuit, a logic circuit 43, and a functional circuit 74 of a phase adjusting circuit.

However the configuration except the above functional circuit 74 has been described heretofore so that the same reference numerals will be given to the same components to omit the description thereof.

The functional circuit 74 comprises an operational comparator 741 in which the power source terminal is connected to HVDD, the ground terminal is connected to VSS, a positive input terminal is connected to the output terminal IN1 of the logic circuit 43, a negative input terminal is connected to the output terminal IN1B of the logic circuit 43, and an output terminal is connected through the output terminal IN2 to the input terminal A of the inverter circuit 41 with output voltage adjusting function.

In addition the functional circuit 74 comprises an operational comparator 742 in which the power source terminal is connected to HVDD, the ground terminal is connected to VSS, a positive input terminal is connected to the output terminal IN1B of the logic circuit 43, a negative input terminal is connected to the output terminal IN1 of the logic circuit 43, and an output terminal is connected through the output terminal IN2B to the input terminal A of the inverter circuit 42 with output voltage adjusting function.

Referring now to FIG. 4, FIG. 7, FIG. 8, and FIG. 9, the detail operations of the third embodiment of the differential output circuit, in the case of that the first embodiment of the operational comparator of the invention is applied to the differential signal output circuit will be described.

Figure 8:
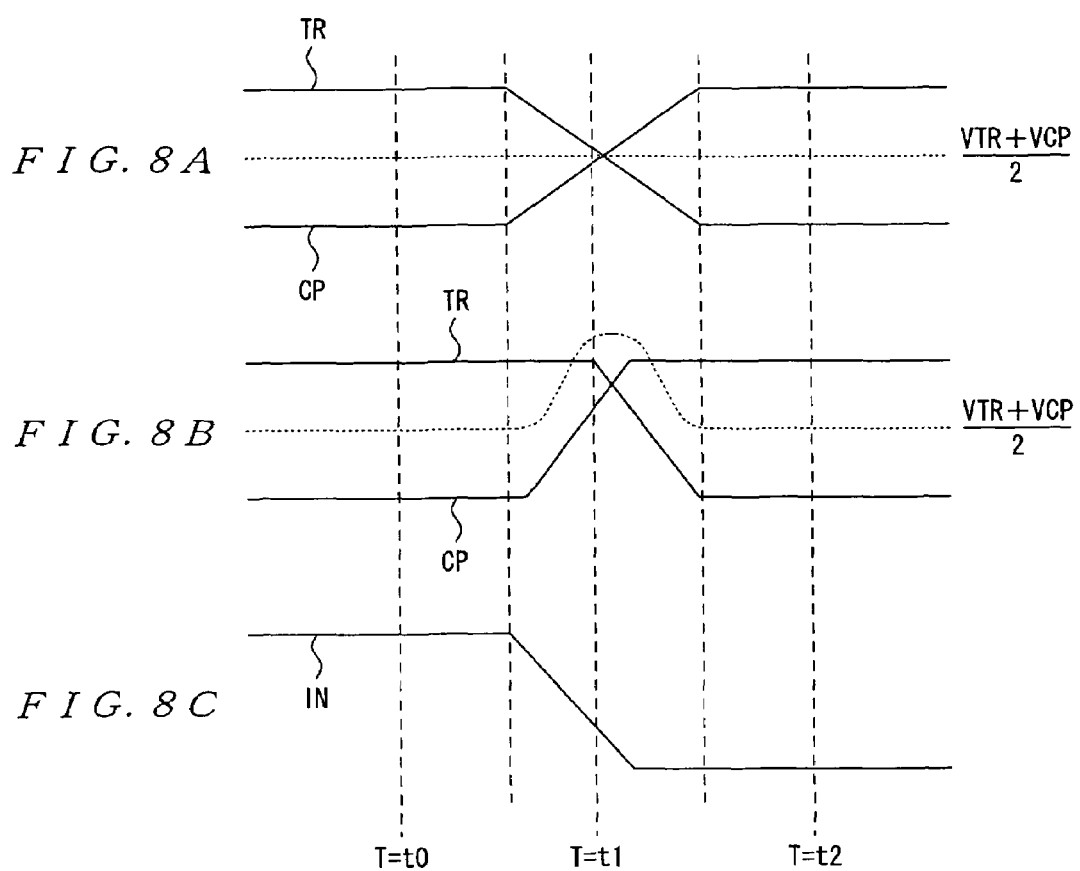
FIG. 8 is a waveform diagram illustrating an example of an input signal and a differential output signal of a differential output circuit of the present invention.

Also in the third embodiment of the differential output circuit, in the case of that the first embodiment of the operational comparator of the invention is applied to the differential signal output circuit, the operations in T=t0 and T=t2 of a stable state in FIG. 8 are the same as the first embodiment of the differential output circuit, in the case of that the first embodiment of the operational comparator of the invention is applied to the differential signal output circuit.

However in the differential output circuit 40 in FIG. 4 a time difference occurs until the change of the input signal IN is reflected in the inverter circuits 41 and 42 with voltage adjusting function through the logic circuit 43.

Figure 9:
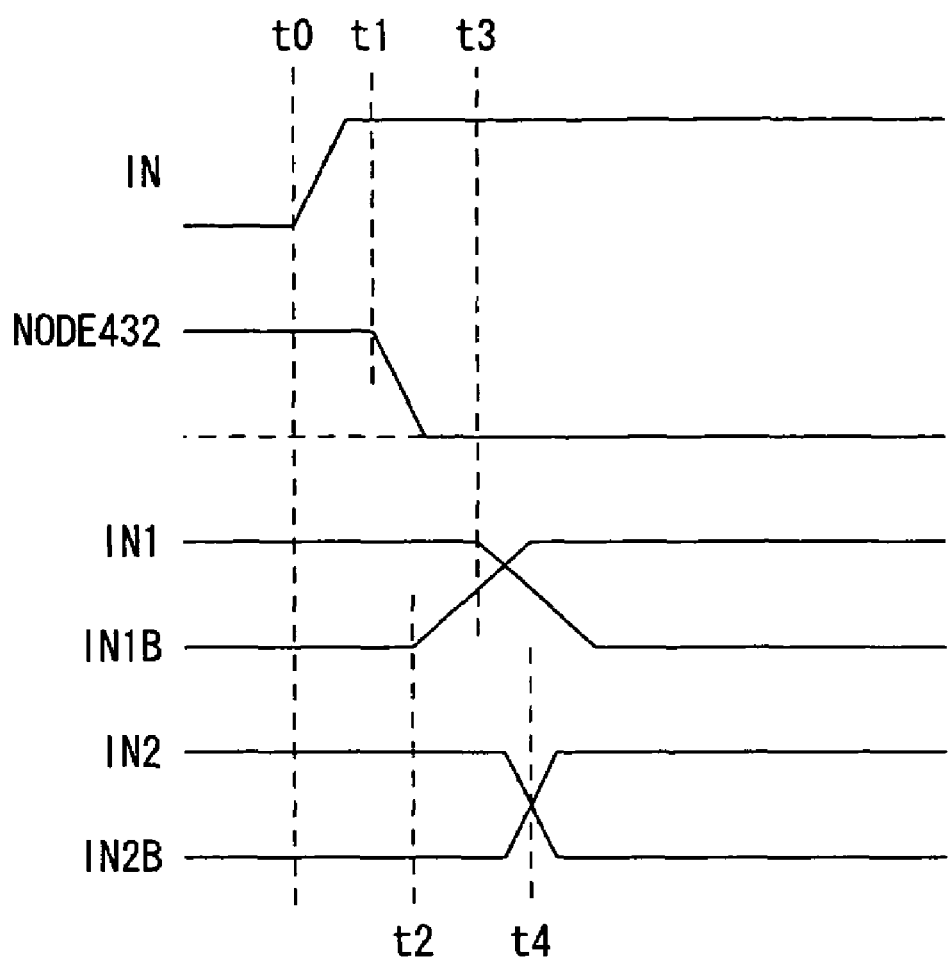
FIG. 9 is a waveform diagram illustrating an example of a state of signals inside of the differential output circuit of the present invention.

In FIG. 9 when the input signal IN changes at the time T=t0, a NODE 432 being an output signal of the inverter circuit 432 changes after passing of a delay time for the inverter circuit 432 (T=t1).

The output terminal IN1 of the logic circuit 43 changes after passing of a delay time for the buffer circuit 431 (T=t2).

The output terminal IN1B of the logic circuit 43 changes after passing of a delay time for the buffer circuit 433 for NODE 432 (T=t3).

Besides since there are the respective different delay-times in the buffer circuit 431 and the inverter circuit 432 in the differential output circuit 40 shown in FIG. 4, a time difference in voltage change occurs in signals TR and CP outputted from the inverter circuits 41 and 42 with output voltage adjusting function, as shown in FIG. 8(B).

In this state the sum of each of voltages VTR and VCP for signals TR and CP changes larger, as shown in FIG. 8(B). Incidentally in FIG. 8, it is illustrated as (VTR+VCP)/2 for convenience of explanation.

As described in the first embodiment of the differential output circuit, in the case of that the first embodiment of the operational comparator of the invention is applied to the differential signal output circuit, since the operational comparator 10 compares VREF=(VTR+VCP)/2, in the logic circuit 43 in FIG. 4, an over-correction occurs at every transition of the input data terminal IN, consequently an Eye pattern due to the voltages VTR and VCP of the pair of the differential signal TR and CP changes in shape so as to interfere with the transmission.

Therefore in the third embodiment of the differential output circuit in the case of that the operational comparator of the invention is applied to the differential signal output circuit, since the above problem may be solved, output signals IN2 and IN2B are generated using the functional circuit 74 which changes in the output voltage because of the difference of voltages between the non-inverted output signal and the inverted output signal of the logic circuit 43.

In the operational comparator 741 since the output terminal IN1 of the logic circuit 43 is connected to the positive input terminal and the output terminal IN1B of the logic circuit 43 is connected to the negative input terminal, a value of the output signal of the operational comparator 741 is determined in view of the magnitude relation of the voltages of these signals.

In the operational comparator 742 since the output terminal IN1B of the logic circuit 43 is connected to the positive input terminal and the output terminal IN1 of the logic circuit 43 is connected to the negative input terminal, a value of the output signal of the operational comparator 742 is determined in view of the magnitude relation of the voltages of these signals.

With referring to FIG. 9, this means changing simultaneously at the time T=t4.

Figure 3:
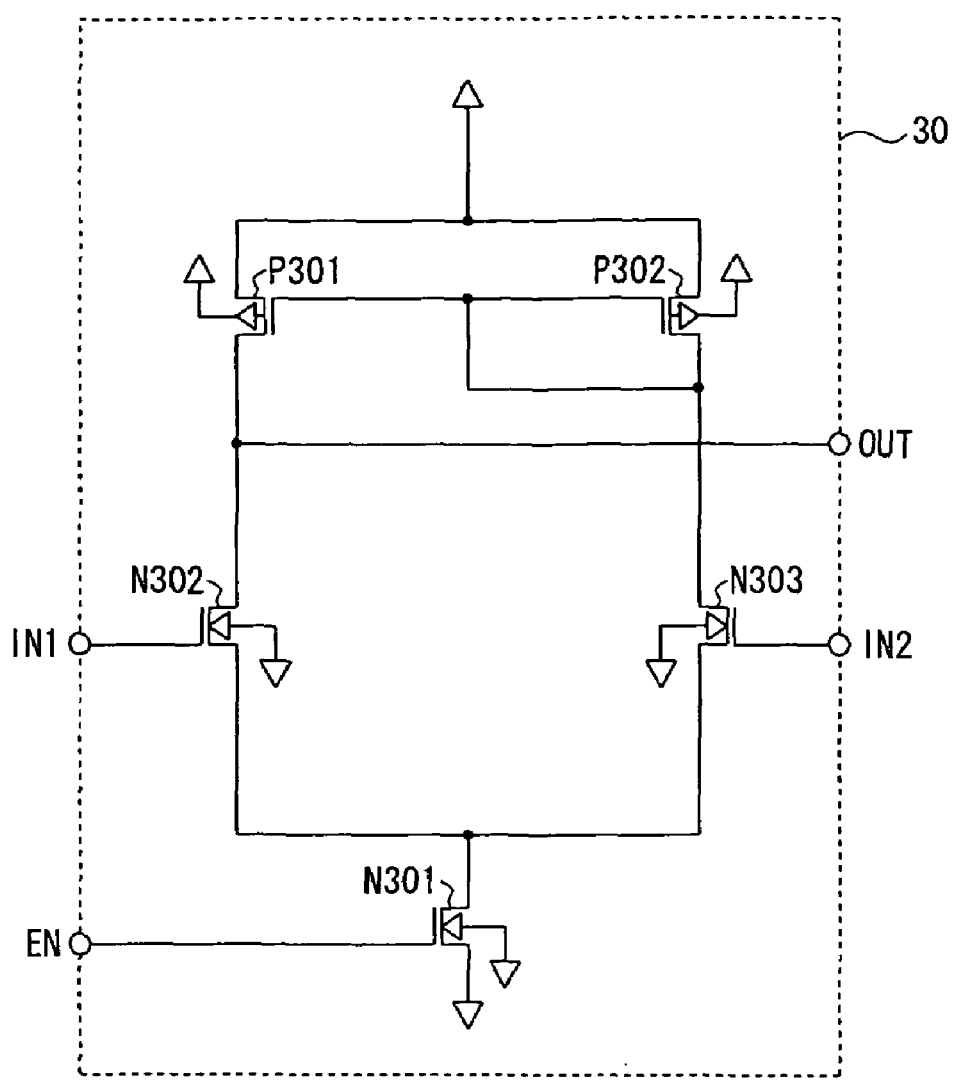
FIG. 3 is a circuit diagram illustrating a known operational comparator.

When the operational comparator shown in FIG. 3 is used to the operational comparators 741 and 742 in the function circuit 74, since the loads, which have to be driven by the output terminals IN1 and IN1B of the logic circuit 43 are equal and the voltages of the output terminals IN2 and IN2B are changed depending on only the cross point of the input terminals IN1 and IN1B in the functional circuit 74, consequently a certain voltage is maintained at the cross point of each of voltages VTR and VCP of the pair of the differential signal TR and CP.

In addition as described above in the functional circuit 74, since the cross points of the voltages of the output terminals IN1 and IN1B of the logic circuits 43 are compared, it is not needed that the power source voltage of the logic circuit 43 and the power source voltage of the functional circuit 74 are equal and thus the power source voltage of the signal passing through the functional circuit 74 may have a level shift function from LVDD to HVDD, by connecting the power source of the logic circuit 43 to LVDD and connecting the power source of the logic circuit 74 to HVDD.

Fourth Embodiment of the Differential Output Circuit

Figure 10:
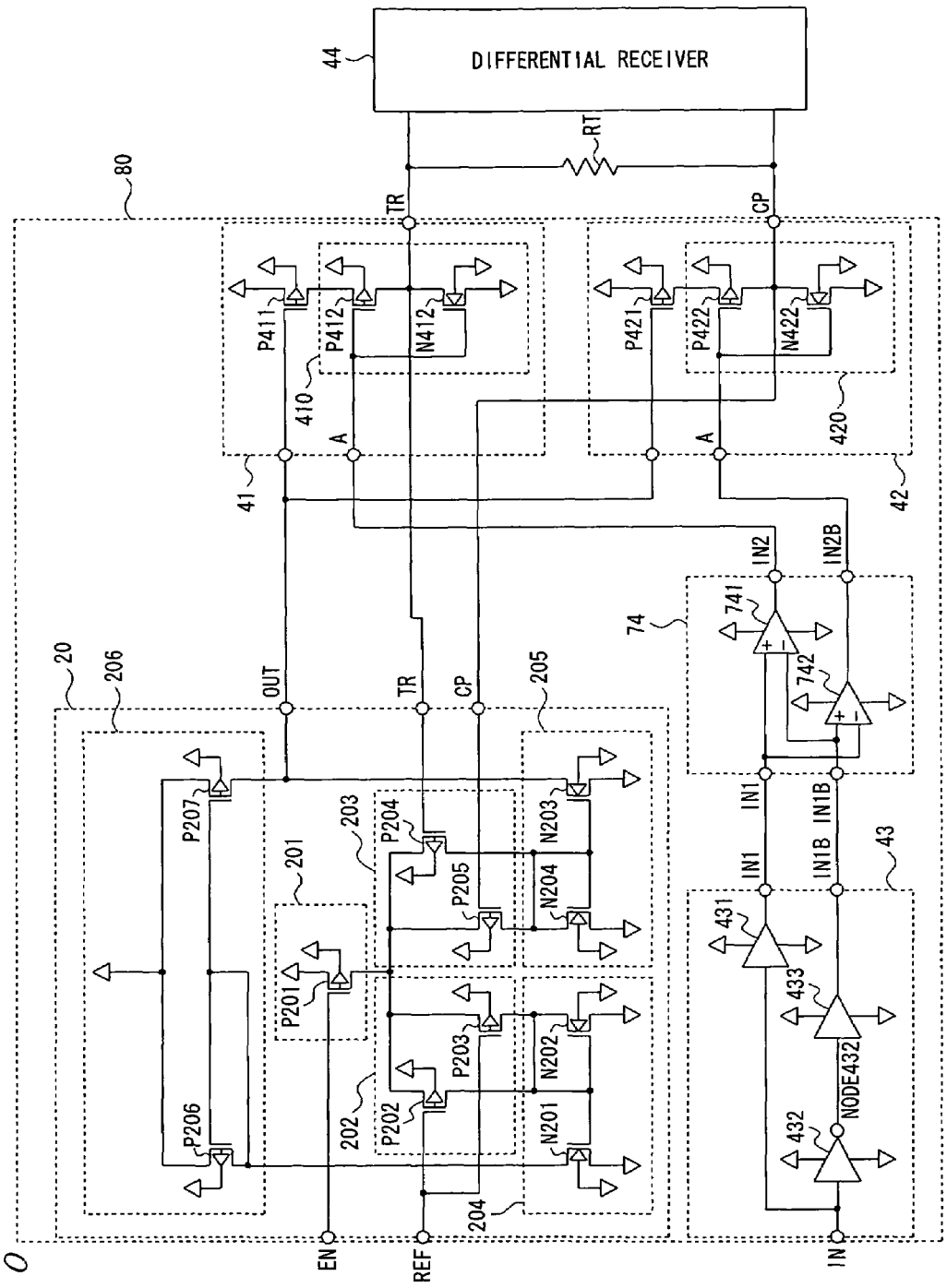
FIG. 10 is a circuit diagram illustrating the configuration according to a fourth embodiment of the differential output circuit of the present invention.

Referring to FIG. 10, the configuration of a fourth embodiment of the differential output circuit, in case of that the second embodiment of the operational comparator of the invention is applied to the differential signal output circuit, will be described.

The fourth embodiment of the differential output circuit of the invention is based on the third embodiment of the differential output circuit shown in FIG. 7 and wherein the operational comparator 10 in FIG. 7 is replaced with the operational comparator 20 in FIG. 2.

Therefore the differential output circuit 80 of the fourth embodiment comprises an operational comparator 20 of a common voltage adjusting circuit, an inverter circuit 41 with output voltage adjusting function of an output circuit, an inverter circuit 42 with output voltage adjusting function of an output circuit, a logic circuit 43, and a functional circuit 74 of a phase adjusting circuit.

However since each of the above configuration elements has been already described, the same reference numerals will be given to the same components to omit the description thereof.

Figure 11:
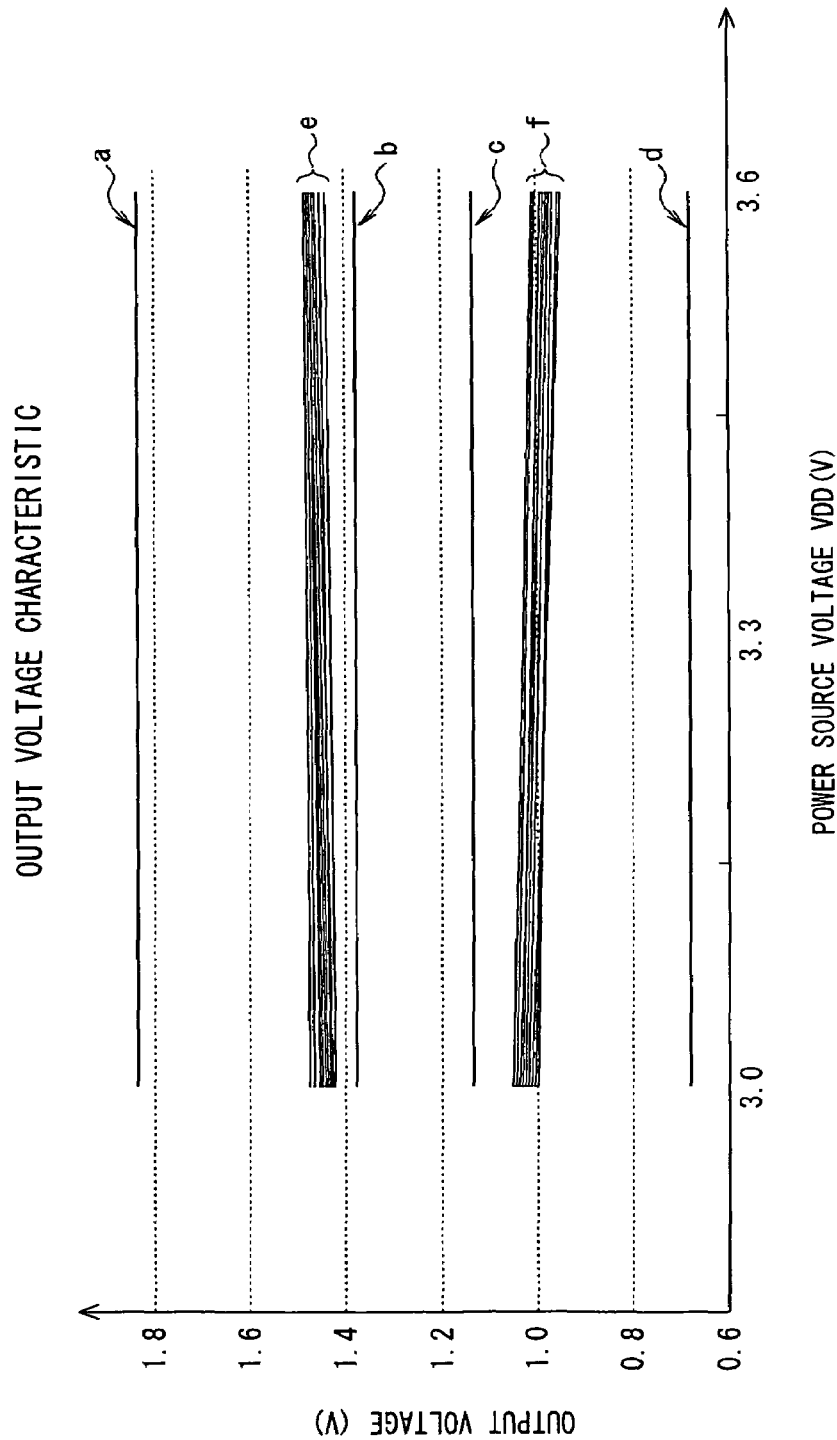
FIG. 11 is a diagram illustrating the output voltage characteristic of a fourth embodiment.

FIG. 11 illustrates a waveform example of the real output voltage in the fourth embodiment of the differential output circuit in the case of that the operational comparator of the invention is applied to the differential signal output circuit.

In FIG. 11, the lateral axis denotes a power source voltage of the differential output circuit, graph a denotes the upper limit of the high level voltage, graph b denotes the lower limit of the high level voltage, graph c denotes the upper limit of the low level voltage, graph d denotes the lower limit of the low level voltage, graph group e denotes the high level output voltage of the differential signal output circuit, and graph group f denotes the low level output voltage of the differential signal output circuit.

The output voltage of the differential output circuit is generally proportional to the power source voltage of the differential output circuit, but in view of FIG. 11, the differential signal output circuit according to the invention may obtain the stable output voltage independent from changing of the power source voltage.

(Aspect Applied to the Product of the Differential Output Circuit)

Figure 13:
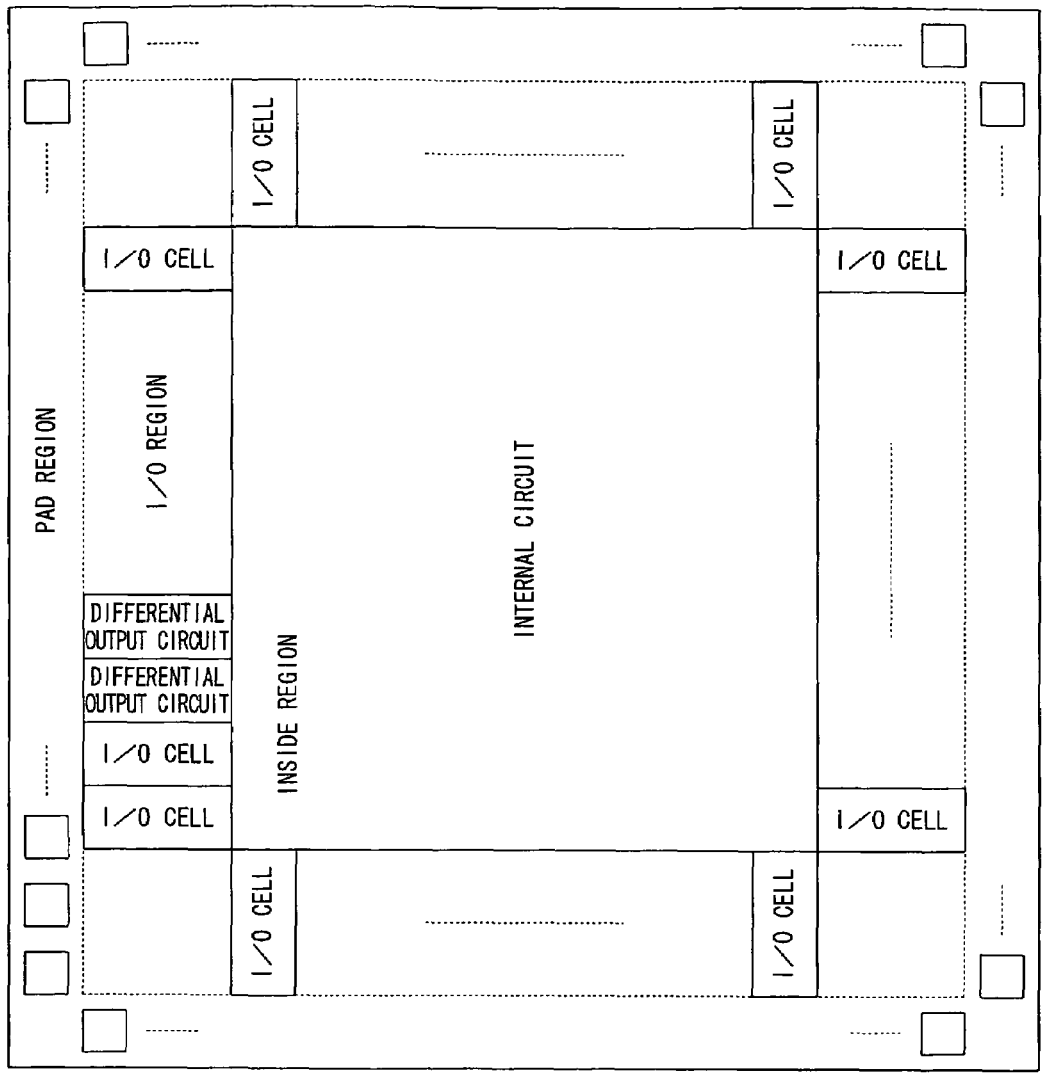
FIG. 13 is a schematic diagram illustrating a semiconductor integrated device to which the present invention is applied.

FIG. 13 illustrates an example of the integrated circuit device comprising the differential output circuit of the embodiment. The integrated circuit device shown in FIG. 13 can be applied to the products of, for example, a gate array, an embedded array, or the like.

The integrated circuit device has an inside region (core region) and I/O region, besides a bonding pad region.

I/O region is formed at the outside of the inside region, specially, I/O region is formed so as to surround the circumstance (square) of the inside region. Also the bonding pad region is formed outside of I/O region, specially, the bonding pad region is formed so as to surround the circumstance (square) of I/O region. In addition a bonding pad provided at the bonding pad region may be provided at I/O region, etc. and in this case the bonding pad region does not needed.

An internal circuit (core circuit) of the integrated circuit device is located in the inside region. This internal circuit may comprise a CPU, a RTC, a display driver, a memory, an interface circuit, or various kinds of logic circuits.

A plurality of I/O cells (input buffer circuit, output buffer circuit, input/output buffer circuit, or power source cell) are located in I/O region. Specially, for example, a plurality of I/O cells are located side by side so as to surround the circumstance (each side) of the internal circuit. In addition each bonding pad which is connected to each I/O cell is located in the bonding pad region. In addition the location of the inside region, I/O region, and the bonding pad region and the location of I/O cell and the bonding pad are not limited in FIG. 13 and the various kinds of variations may be executed.

As shown in FIG. 13, in the present embodiment the differential output circuits 40, 60, 70, or 80 is located in I/O region of the integrated circuit device. Specially, a differential output circuit is located as one of I/O cells. That is to say, the differential output circuit 40, 60, 70, or 80 is celled with the same way as I/O cells to be located in I/O region. In this case the differential output circuit 40, 60, 70, or 80 can be the same size as, for example, I/O cells (at least 2 among a plurality of I/O cells).

Incidentally it is preferred that a plurality of the differential output circuits 40, 60, 70, and 80 can be formed in I/O region and the plurality of the differential output circuits 40, 60, 70, and 80 can operate independently.

In addition in the case of that the internal circuit comprises a plurality of circuit blocks (a CPU, a RTC, a memory, and the like), it is preferred that at least one differential output circuit among the plurality of the differential output circuits 40, 60, 70, and 80 operates to each circuit block of the plurality of the circuit blocks.

For example, as a technique of an exemplary of comparison which locates the differential output circuits 40, 60, 70, or 80 in the integrated circuit device, a technique is considered that macro blocking of these circuits, locating of this macro block in the specific part of the integrated circuit device, or locating of it in the region including a part of I/O region.

However the location according to the exemplary of comparison, a restriction occurs on the pin layout so that the freedom degree of a user's pin layout on the custom product is difficult to be secured.

In contrast according to the technique of the embodiment in FIG. 13, the differential output circuits 40, 60, 70, or 80 can be located at an optional position in I/O region, hence, the freedom degree of a user's pin layout on the custom product can be secured and the product power can be improved.

In addition in the embodiment in the differential output circuits 40, 60, 70, or 80, the inverter circuits 41 and 42 with output voltage adjusting function and the functional circuit 74 are generated (located) in the region of the high voltage transistor (a transistor of which withstand voltage is a first voltage) and the logic circuit 43 is formed by the low transistor (a transistor of which withstand voltage is a second voltage higher than the first voltage). The low voltage transistor is a transistor of which maximum standard (absolute maximum standard) is lower than that of the high voltage transistor and the high voltage transistor is a transistor of which absolute maximum standard is higher than that of the low voltage transistor. Specially high voltage transistor is a transistor of which, for example, the gate oxide film is thicker than that of the low voltage transistor.

For example, in FIG. 4 or FIG. 6 the differential input terminal TR or CP of the differential comparison circuit 10 or 20 is connected to the bonding pad in order to connect a signal from the external. Therefore if ESD (electrostatic discharge) is applied from the external, it is applied directly to the gate terminals of N channel MOS transistor N104 or N105 of the operational comparator 10 or 20 through the bonding pad, thereby such a transistor would encounter an electrostatic destroy.

This is caused by that in the case of that ESD is applied to the source terminal or the drain terminal in MOs transistor the voltage of ESD per area becomes low because these areas are geographically larger than that of the gate terminal, and while a breakdown occurs in the joint not channel-formed due to the voltage of ESD so that the carriers can move, there is no moving route of the carrier of ESD in the gate terminal of which the area is geographically small.

Therefore while ESD (electrostatic discharge) protect circuit is needed for the differential input terminal TR or CP, because the differential input terminals TR or CP are connected to only the gate terminal, and have extremely high input impedance, the degradation of input signal due to ESD protect circuit can be prevented as much as possible. Hence the situation of an electrostatic destroy of transistor can be prevented effectively and a reliability of it can be improved.

Recently in order to realize high integrality, high speed, or low consumed power consumption, the internal block of the integrated circuit is constituted of low voltage transistors to make the power source voltage low. On the other hand an interface of the signals with the external the power voltage does not become low as much as the internal block in view of certainty or noise resistance property, thereby operating in the conventional power source. Hence even in this meanings it becomes advantage that the inverter circuit 41 or 42 with output voltage adjusting function and the functional circuit 74 are formed with the high voltage transistor (a transistor operating with HVDD).

Figure 14:
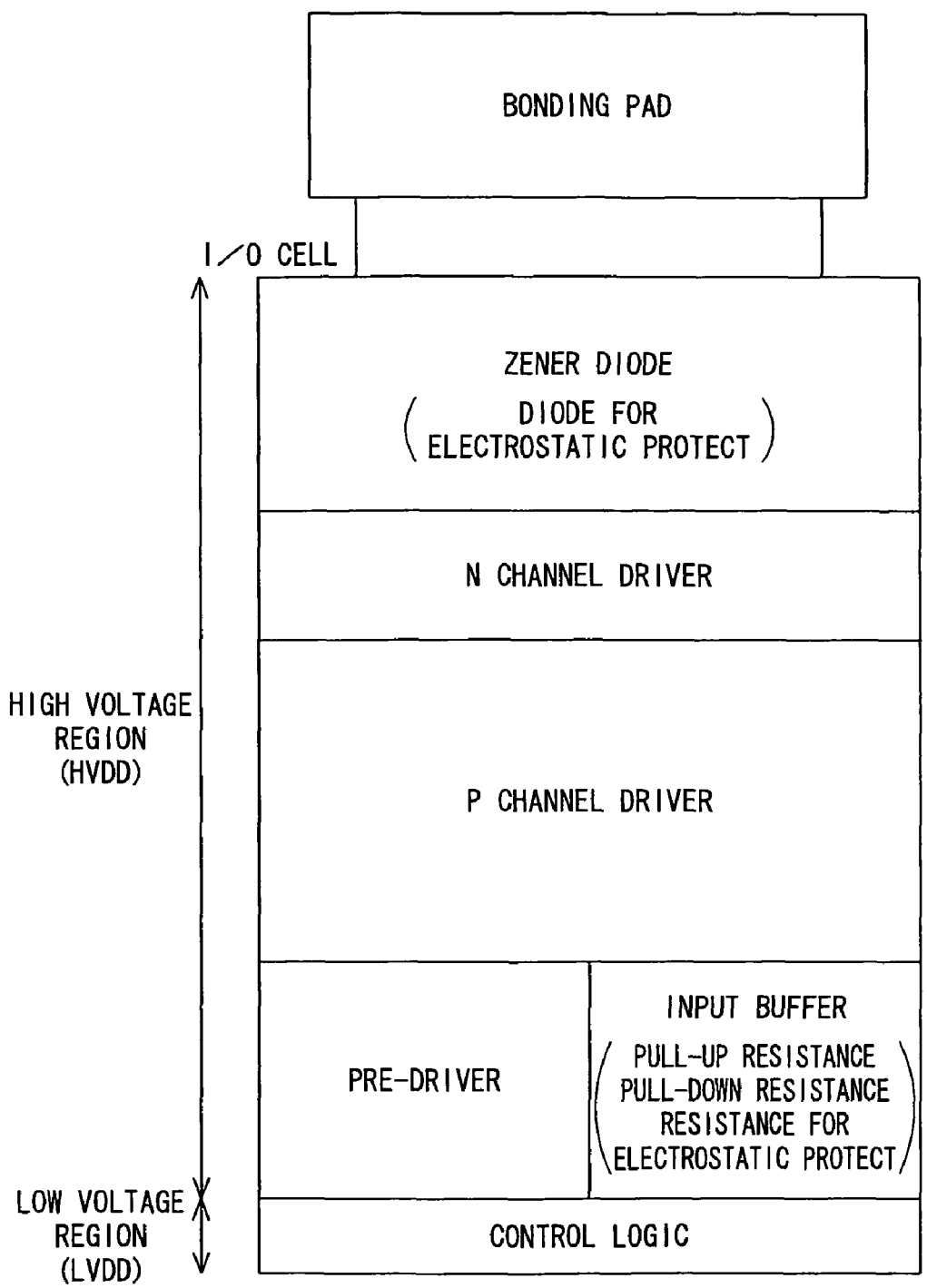
FIG. 14 is a configuration diagram of I/O cell.

FIG. 14 illustrates an exemplary of a layout of I/O cell. In this I/O cell a zener diode is located which functions as a diode for electrostatic protect. Also in I/O cell N channel driver or P channel driver for driving signal lines connected to the bonding pad. These N channel driver and P channel driver become to be very large in transistor size, compared with the other transistors in I/O cell.

Also in I/O cell an input buffer circuit and a pre-driver are located. The input buffer circuit includes pull-up resistance elements (transistors for pull-up), pull-down resistance elements (transistors for pull-down), resistance elements for electrostatic protect. Also the pre-driver includes transistors for driving N channel drivers or P channel drivers. Also in I/O cell a control logic is located and this control logic includes a various logic circuits for controlling the pre-driver or the input buffer circuit.

In addition in FIG. 14, a zener diode, N channel driver, P channel driver, a transistor for P channel input buffer circuit, a transistor for N channel input buffer circuit, a transistor for P channel pre-driver, and a transistor for N channel pre-driver are located in the high voltage region (HVDD region). On the other hand a transistor for N channel control logic and a transistor for P channel control logic are located in the low voltage region (LVDD region).

As described above, constituting orderly of the high voltage region and low voltage region would not only allow the bound of the features (for example, a thickness of gate oxide film, etc.) for configuration of the high resistant region and low resistant region to reduce as much as possible but also allow the bound of the features (well bound, etc.) for configuration of N channel and P channel regions to reduce as much as possible. Therefore the present invention can be implemented with simplified configuration and with ease.

Figure 15:
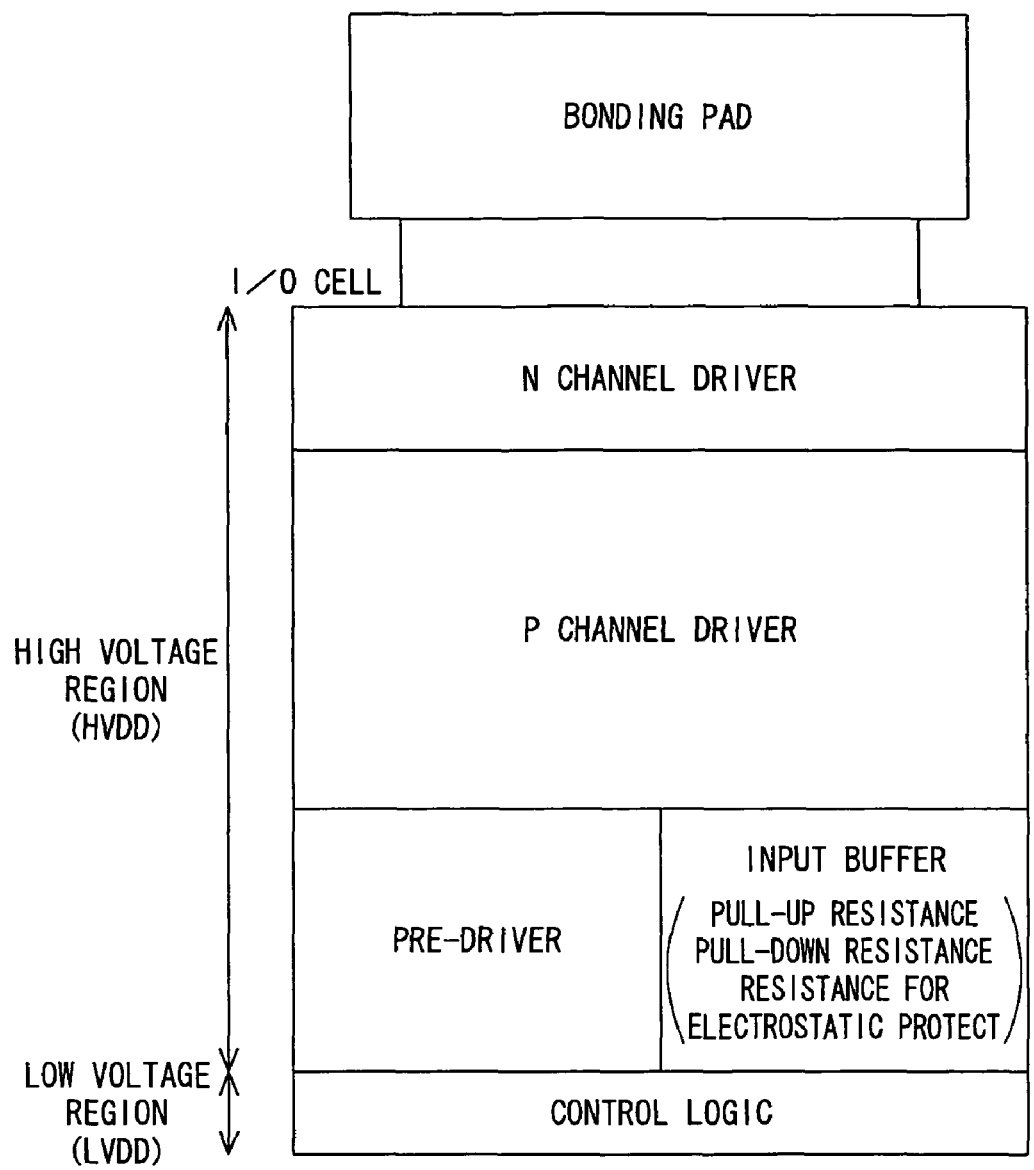
FIG. 15 is a configuration diagram of I/O cell.

As shown in FIG. 15 a variation can be implemented in which a zener diode is not located. In addition in the case of constituting of transistors in low voltage region, despite not discriminating high voltage/low voltage in a region or a transistor in the integrated circuit device, or discriminating high voltage/low voltage in a region or a transistor in the integrated circuit device, the differential output circuit of the present invention does not need to be located in the high voltage region.

According to the embodiment since the differential output circuit is formed using the elements such as a transistor and resistance located in I/O cell, the differential output circuits 40, 60, 70, and 80 may be located in the optional position in I/O region as shown in FIG. 13. As a result it can improve freedom degree of the layout of pins and enhance withstand voltage for ESD, thereby improving the reliability.

It is natural that the differential output circuits 40, 60, 70, and 80 output two signals from the integrated circuit device to the external because of outputting the pair of the differential signal. Therefore in view of the phase difference of the differential output signal TR and CP, it is desired that they are located in the closed to I/O regions respectively.

In addition it is preferable in characteristic that the operational comparator 10 or 20 for comparing the voltages VTR and VCP of the differential output signal TR and CP with the reference voltage VREF may contact with I/O regions in which the differential output circuits 40, 60, 70, and 80 are located.

Therefore the differential output circuits of the present invention are located in the closed to I/O regions. This matches with the improvement of the freedom degree of pin layout and the improvement of the withstand voltage for ESD as described previously.

For example in the third embodiment of the differential output circuit of the invention (refer to FIG. 7) the inverter circuits 41 and 42 with output voltage adjusting function are located in N channel driver or P channel driver region (high voltage region), the operational comparator 10 and the functional circuit 74 is located in a transistor for P channel pre-driver and a transistor for N channel pre-driver (high resistant regions), and the logic circuit 43 is located in a transistor for N channel control logic or P channel control logic (low voltage region). Incidentally the operational comparator 10 may be located in the low voltage region closed to the high voltage region of the bonding pad.

On the other hand these configuration may be applied to the fourth embodiment of the differential output circuit (refer to FIG. 10).

Figure 16:
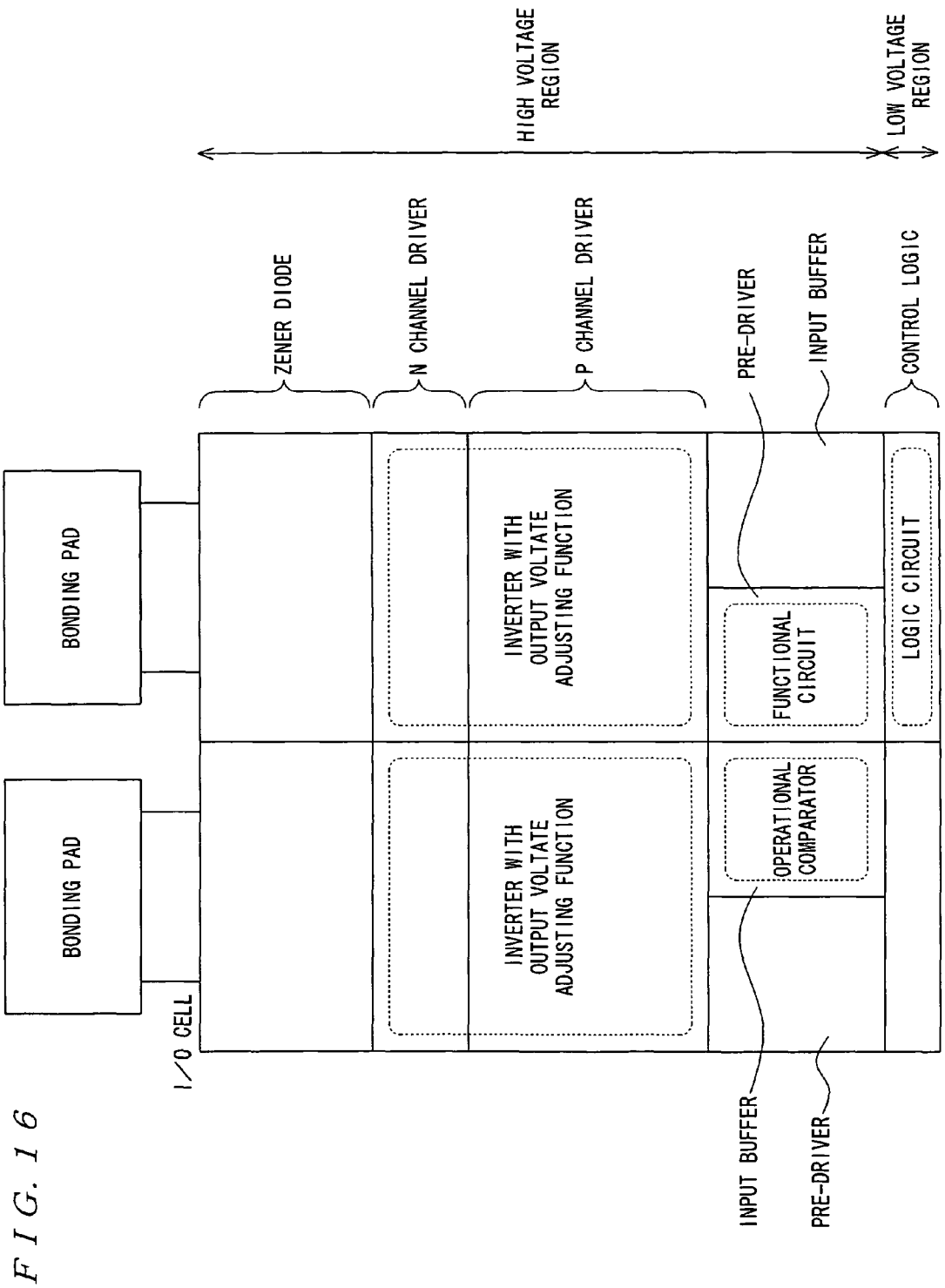
FIG. 16 is a circuit diagram illustrating a location example of the differential output circuit of the present invention.

In addition the differential output circuits 40, 60, 70, or 80 of the invention is provided with at least two bonding pads. Therefore as shown in FIG. 16, if the differential output circuits are located in the closed to I/O regions and the operational comparator 10, the functional circuit 74, and the logic circuit 43 are located in the left or right closed to parts of the high voltage regions, a differential output circuit can be provided in which the length of the signal wiring becomes short and the characteristic is improved.

In addition only the differential output circuits 40, 60, 70, and 80 may be constituted with a part of MOS transistors provided in I/O regions and the remaining MOS transistors become not-used MOS transistors, thus this is not economy. Therefore a high integrality will be realized by constituting the operational comparator 10 or 20, the logic circuit 43, and the functional circuit 74 with these not-used MOS transistors. This point is also reasonable because of matching with the generation (location) method of the differential output circuits 40, 60, 70, and 80 as described previously.

Although preferred embodiments of the present invention have been described, it would be appreciated by those skilled in the art that many changes may be made in these embodiments without departing essentially from the new matters and advantages of the invention, therefore, the embodiments of these variations would be included within the scope of the present invention and the equivalents.

For example, the terms (VSS, HVDD, LVDD, N channel, P channel, reference voltage, etc.) described in accompanied with the different terms with broad or same meaning (first power source, second power source, and the like) at least one time in the specification and the drawings can be replaced with the different terms anywhere in the specification or drawings.

In addition the configurations and the operations of the operational comparator, the differential output circuit, and the integrated circuit device also would not be limited in the description of the invention and many variations can be implemented. For example, the connection relationship of the transistors constituting the operational comparators or the differential output circuits can be changed and such a variation in which the other transistors, the resistance elements, or the like is added can be implemented.

In addition, the layouts of the integrated circuit devices also would not be limited in the description of the embodiments. Also the combined configurations of the variations described in the embodiments can be included within the scope of the invention.

What is claimed is

1. A differential output circuit, comprising:
a digital circuit that receives a power voltage from a first power source and a third power source, and generates a first non-inverted output signal and a second inverted output signal related to a first input signal;
a first output circuit that receives a power voltage from the first power source and a fourth power source, and controls an output voltage for a first side signal in a differential signal related to a first output signal;
a second output circuit that receives and operates by a power voltage from the first power source and the fourth power source, and controls an output voltage for a second side signal in the differential signal related to a second output signal; and
a first common voltage control circuit that receives and operates by a power voltage from the first power source and a second power source, and outputs a comparison result of both voltages of output terminals of the first output circuit and the second output circuit with a reference voltage, wherein
the first output circuit has a first control circuit that controls the output voltage for the first side signal in the differential signal,
the second output circuit has a second control circuit that controls the output voltage for the second side signal in the differential signal, and
the first control circuit and the second control circuit control voltages for the first side signal and the second side signal in the differential signal to adjust a common voltage of the differential signal related to the comparison result from the first common voltage control circuit.

2. The differential output circuit according to claim 1, wherein the first common voltage control circuit comprises an operational comparator comprising:
a first current source circuit that receives a first power voltage from the first power source;
a first load circuit that is coupled to the first current source circuit, including a first transistor having a first gate terminal coupled to a reference voltage;
a second load circuit that is coupled to the first current source circuit, including a second transistor and a third transistor coupled to the second transistor in parallel; and
a first current mirror circuit that receives a second power voltage from the second power source,
a second gate terminal of the second transistor receiving a first signal, and
a third gate terminal of the third transistor receiving a second signal whose phase is opposite to a phase of the first signal.

3. A semiconductor integrated circuit comprising an output circuit, wherein
the output circuit comprises the first output circuit and the second output circuit according to claim 1, and
the first output circuit and the second output circuit are located within a high voltage region near by a bounding pad.

4. A semiconductor integrated circuit comprising an operational comparator and an output circuit, wherein
the operational comparator and the output circuit comprise the operational comparator and the first output circuit and the second output circuit according to claim 2, and
the operational comparator is located within a high voltage region between the first output circuit and the second output circuit.

5. A semiconductor integrated circuit comprising an operational comparator and an output circuit, wherein
the operational comparator and the output circuit comprise the operational comparator and the first output circuit and the second output circuit according to claim 2, and
the operational comparator is located within a low voltage region near and between the first output circuit and the second output circuit.

6. A differential output circuit, comprising:
a digital circuit that receives a power voltage from a first power source and a third power source, and generates a first non-inverted output signal and a second inverted output signal, related a first input signal;
a phase adjusting circuit that receives a power voltage from the first power source and a fourth power source and generates a third output signal and a fourth output signal which has a different phase by 180 degrees from that of the third output signal, related to the first non-inverted output signal and the second inverted output signal;
a first output circuit that receives a power voltage from the first power source and the fourth power source, and generates a first side signal in a differential signal related to the third output signal;
a second output circuit that receives a power voltage from the first power source and the fourth power source, and generates a second side signal of the differential signal related to the fourth output signal; and
a first common voltage adjusting circuit that receives a power voltage from the first power source and a second power source, and outputs a comparison result of both voltages of output terminals of the first output circuit and the second output circuit with a reference voltage, wherein
the first output circuit has a first control circuit that controls an output voltage for the first side signal in the differential signal,
the second output circuit has a second control circuit that controls an output voltage for the second side signal in the differential signal, and
the first control circuit and the second control circuit control voltages for the first side signal and the second side signal in the differential signal to adjust a common voltage of the differential signal, related to the comparison result from the first common voltage control circuit.

7. The differential output circuit according to claim 6, wherein the first common voltage control circuit comprises an operational comparator comprising:
a first current source circuit that receives a first power voltage from the first power source;
a first load circuit that is coupled to the first current source circuit, including a first transistor having a first gate terminal coupled to a reference voltage;
a second load circuit that is coupled to the first current source circuit, including a second transistor and a third transistor coupled to the second transistor in parallel;
a first current mirror circuit that receives a second power voltage from the second power source, wherein
a second gate terminal of the second transistor receiving a first signal, and a third gate terminal of the third transistor receiving a second signal whose phase is opposite to a phase of the first signal.

8. A semiconductor integrated circuit comprising an output circuit, wherein
the output circuit comprises the first output circuit and the second output circuit according to claim 6, and
the first and the second output circuits are located within a high voltage region near by a bonding pad.

9. A semiconductor integrated circuit comprising an operational comparator and an output circuit, wherein
the operational comparator and the output circuit comprise the operational comparator and the first output circuit and the second output circuit according to claim 7, and
the operational comparator is located in a high voltage region between the first output circuit and the second output circuit.

10. A semiconductor integrated circuit comprising an operational comparator and an output circuit, wherein
the operational comparator and the output circuit comprise the operational comparator and the first output circuit and the second output circuit according to claim 7, and
the operational comparator is located in a low voltage region near and between the first output circuit and the second output circuit.

* * * * *